United States Patent
Yagishita et al.

(10) Patent No.: US 6,310,367 B1
(45) Date of Patent: Oct. 30, 2001

(54) MOS TRANSISTOR HAVING A TENSILE-STRAINED SI LAYER AND A COMPRESSIVE-STRAINED SI-GE LAYER

(75) Inventors: Atsushi Yagishita; Kouji Matsuo, both of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/510,239

(22) Filed: Feb. 22, 2000

(30) Foreign Application Priority Data

Feb. 22, 1999 (JP) .................................. 11-042729

(51) Int. Cl.[7] ...................... H01L 31/072; H01L 31/109; H01L 31/0328; H01L 31/0336
(52) U.S. Cl. ............................................. 257/190; 257/19
(58) Field of Search .................................. 257/18, 19, 190

(56) References Cited

U.S. PATENT DOCUMENTS 5,357,119 * 10/1994 Wang et al. ........................... 257/18
6,059,895 * 5/2000 Chu et al. ........................... 148/33.1
6,111,267 * 8/2000 Fischer et al. ........................ 257/19

FOREIGN PATENT DOCUMENTS 7-321222   12/1995 (JP) .
9-219524    8/1997 (JP) .

OTHER PUBLICATIONS

A. Sadek et al., "Design of Si/SiGe Heterojunction COmplementary Metal–Oxide–Semiconductor Transistors," IEEE Transactions on Electron Devices, Vol. 143, No. 8, August 1996.

* cited by examiner

Primary Examiner—Ngân V. Ngô
(74) Attorney, Agent, or Firm—Finnegan, Henderson, Farabow, Garrett & Dunner, L.L.P.

(57) ABSTRACT

A semiconductor device in which an NMOSFET and a PMOSFET are formed in a silicon substrate, wherein the gate electrodes of NMOSFET and PMOSFET are made of metallic materials, an Si—Ge layer is formed in at least part of the surface regions including the respective channel layers of the NMOSFET and PMOSFET, and the concentration of Ge in the channel layer of the NMOSFET is lower than the concentration of Ge in the channel layer of the PMOSFET.

18 Claims, 23 Drawing Sheets

NMOS
(CHANNEL: TENSILE STRAINED Si)

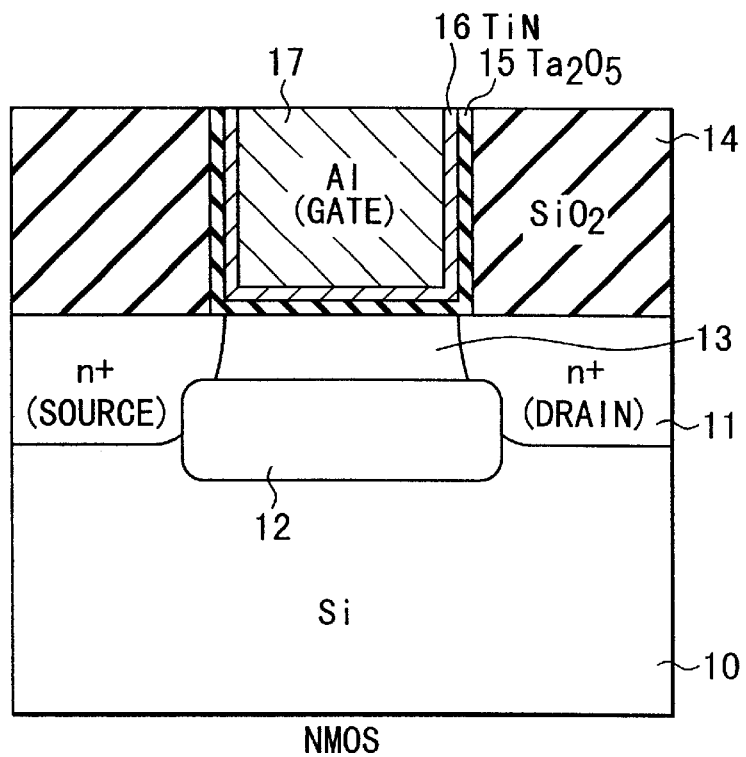
FIG. 1A  NMOS (CHANNEL: TENSILE STRAINED Si)
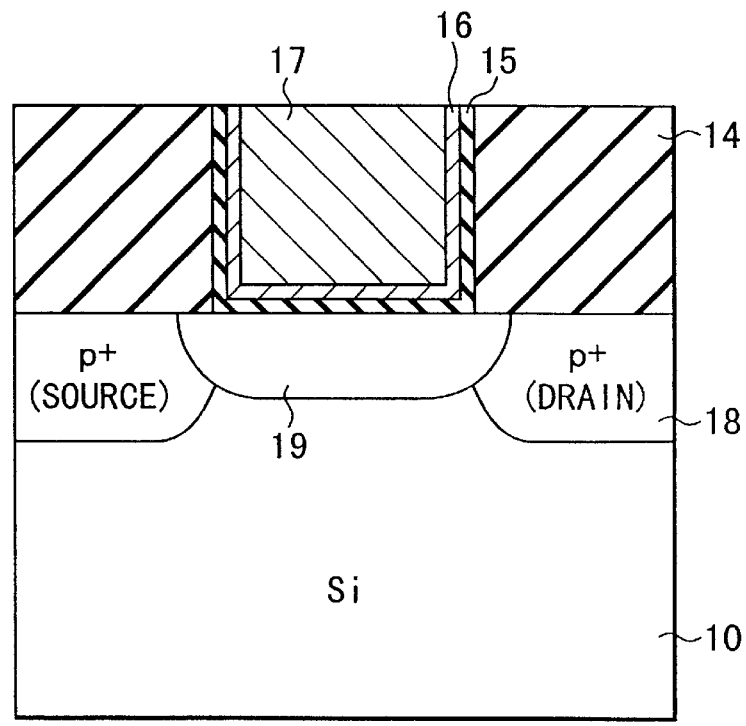
FIG. 1B  PMOS (CHANNEL: Si-Ge)

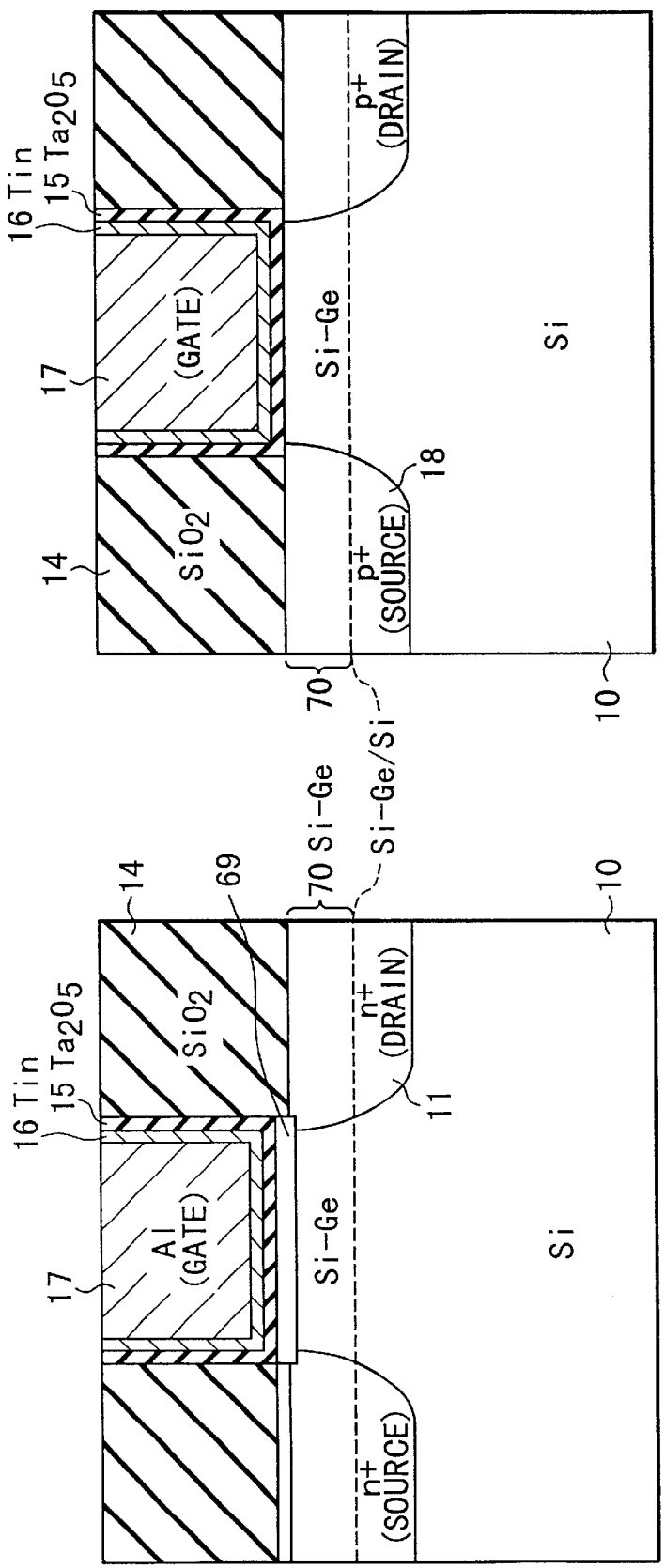

MOS TRANSISTOR HAVING A TENSILE-STRAINED SI LAYER AND A COMPRESSIVE-STRAINED SI-GE LAYER

CROSS-REFERENCE TO RELATED APPLICATION

This application is based upon and claims the benefit of priority from the prior Japanese Patent Application No. 11-042729, filed Feb. 22, 1999, the entire contents of which are incorporated herein by reference.

BACKGROUND OF THE INVENTION

This invention relates to a semiconductor device using a tensile-strained Si layer and a compressive-strained Si—Ge layer as the channel layers infield-effect transistors and a method of manufacturing the semiconductor device.

In ordinary semiconductor devices, a Si bulk has been used as a substrate and high-speed operation and less power consumption have been achieved by miniaturizing the constituting elements of the semiconductor devices. The miniaturization, however, is now coming closer to the physical and economical limitations. Thus, in the future, it will be necessary to establish the techniques for achieving high-speed operation and less power consumption by other approaches than the miniaturization.

For instance, the technique for achieving high-speed operation by using metal gates for gate electrodes to suppress delay in the wiring of gates has been developed. To form metal gates and high dielectric gate insulating films in CMOSFETs, a dummy gate process has been proposed (A. Chatterjee, et al., IEDM Tech. Dig., 1997, p. 821 and A. Chatterjee, et al., Japanese Patent Laid Open (kokai) No. 7-321222). The dummy gate process includes a process of forming a dummy gate, which is disposed in advance, in a region in which an actual gate is to be formed, then forming a source and a drain by self-alignment techniques with the dummy gate as a mask, and thereafter replacing the dummy gate with the actual gate.

The technique has difficulty of adjusting the threshold voltage of the transistor due to the influence of the work function of the metal gate. For instance, when a gate electrode is made of TiN, the value of the work function ranges from 4.3 to 4.6 eV. Thus, the gate electrode has the problem that the threshold voltage is higher than that of a conventional polysilicon electrode by about 0.4 to 0.5V.

To improve the carrier mobility in a channel layer, the technique for using a tensile-strained Si layer on an Si—Ge layer (under a tensile stress) as the channel layer of an N-MOS transistor and a compressive-strained Si—Ge layer (under a compressive stress) as the channel layer of a P-MOS transistor has been reported (K. Ismail, "Si/Si—Ge High-Speed Field-Effect Transistors," IEDM Tech. Dig., 1995, p.509). By using a tensile-strained Si layer or a compressive-strained Si—Ge layer as the channel layers of MOS transistors, the mobility of electrons and holes at the surface increases, making high-speed operation compatible with less power consumption.

This technique, however, has the following problem: when a CMOSFET with a tensile-strained Si layer (n-channel layer) and a compressive-strained Si—Ge layer (p-channel layer) both formed as the channel layers is formed, the processes are complex and it is difficult to selectively form an NMOS channel layer and a PMOS channel layer. Since an Si—Ge layer is formed by a high-temperature heat treatment, the Si—Ge layer misfit dislocation or the segregation of Ge takes place, thereby degrading the gate breakdown voltage characteristic.

It is known that, when a MOSFET is operated on an SOI substrate, holes are accumulated in the substrate at the end of the channel layer (near the source) and what is called the floating body effect occurs, having an adverse effect on the operation of the device. To suppress the floating body effect, a method of making the source region of Si—Ge material to make the bandgap smaller than that of the channel layer (Si) and thereby drawing holes into the source region has been proposed (Akira Nishiyama, et al., "Formation of Si—Ge source/drain using Ge implantation for floating-body effect resistant SOI MOSFETS," Jpn. J. Appl. Phys. Vol. 35, pp. 954–959, Part 1, No. 28, February 1996).

This method, however, has the problem of being unable to make the channel layer of Si—Ge material. That is, the method cannot make the improvement of the mobility of holes compatible with the suppression of the floating body effect.

As described above, an FET using a metal gate cannot secure sufficient driving current because of its higher threshold voltage.

Furthermore, it is difficult to form a CMOSFET in which an NMOSFET using a tensile-strained Si layer formed on an Si—Ge layer as a cannel layer and a PMOSFET using a compressive-strained Si—Ge layer as a channel layer are used.

In addition, when the source region is made of Si—Ge material to make the bandgap smaller than that of the channel layer and thereby suppress the floating body effect of the FET formed at the surface of an SOI substrate, the Si—Ge material cannot be used for the channel layer, which prevents the device from operating faster.

BRIEF SUMMARY OF THE INVENTION

An object of the present invention is to provide a semiconductor device capable of lowering the threshold voltage of a CMOSFET using a metal gate and improving the driving capability or the speed of the device and a method of manufacturing the semiconductor device.

Another object of the present invention is to provide a semiconductor device manufacturing method of easily forming a CMOSFET in which an NMOSFET using a tensile-strained Si layer as a channel layer and a PMOSFET using a Si—Ge layer as a channel layer are used.

Still another object of the present invention is to provide a semiconductor device capable of making the improvement of the mobility of electrons in an FET formed at the surface of an SOI substrate compatible with the suppression of the floating body effect.

In a semiconductor device according to the present invention in which an NMOSFET and a PMOSFET have been formed in a silicon substrate, the gate electrodes of the NMOSFET and PMOSFET are made of metallic materials, an Si—Ge layer is formed in at least part of the surface regions including the respective channel layers of the NMOSFET and PMOSFET, and the concentration of Ge in the channel layer of the NMOSFET is lower than the concentration of Ge in the channel layer of the PMOSFET.

Preferred modes of the semiconductor device according to the present invention are as follows:

(a) The silicon substrate is an SOI substrate and the concentration of Ge in the channel layer of the MOSFET is lower than the concentration of Ge in the source of the MOSFET.

(b) An Si layer on the Si—Ge layer is used as the channel layer of the NMOSFET and the Si—Ge layer is used as the channel layer of the PMOSFET. The thickness of the Si layer on the Si—Ge layer is ranged between 2 nm to 30 nm. The Si—Ge layer of the NMOSFET is formed as $Si_{1-x}Ge_x(0.1 \leq x \leq 0.9)$.

(c) A stacked structure of the Si—Ge layer and Si layer is formed only almost under the gate electrode of the channel region of the NMOSFET.

(d) The height of the surface of the gate electrode of the NMOSFET is equal to the height of the surface of the gate electrode of the PMOSFET.

(e) Gate insulating films for the NMOSFET and PMOSFET are made of $Ta_2O_5$.

(f) The part of the respective gate electrodes of the NMOSFET and PMOSFET are made of TiN.

(g) Gate insulating films for the NMOSFET and PMOSFET are made of $Ta_2O_5$ and the part of the respective gate electrodes of the NMOSFET and PMOSFET are made of TiN.

In a semiconductor device according to the present invention in which an NMOSFET is formed on a silicon substrate, the gate electrode of the NMOSFET is made of metallic material, and a tensile-strained Si layer on an Si—Ge layer is used as the channel layer of the NMOSFET.

Preferred modes of the semiconductor device are as follows:

(a) The silicon substrate is an SOI substrate and the concentration of Ge in the channel layer of the MOSFET is lower than the concentration of Ge in the source of the MOSFET.

(b) An Si layer on the Si—Ge layer is used as the channel layer of the NMOSFET and the Si—Ge layer is used as the channel layer of the PMOSFET.

(c) A stacked structure of the Si—Ge layer and Si layer is formed only almost under the gate electrode of the channel region of the NMOSFET.

A method of manufacturing semiconductor devices according to the present invention comprising: the step of forming a dummy gate in the gate formation region in each of an NMOSFET and a PMOSFET being formed in a silicon substrate; the step of selectively introducing impurities into the NMOSFET section and PMOSFET section at the surface of the silicon substrate with the dummy gates as masks and heating the impurity-introduced portions to form diffused layers serving as the sources and drains of the NMOSFET and PMOSFET; the step of forming an insulating film thicker than the dummy gates on the silicon substrate; the step of flattening the surface of the insulating film and exposing the top surface of the dummy gates; the step of removing the dummy gates and making a groove in the insulating film to allow the silicon substrate to be exposed at the bottom of the groove; the step of forming not only a stacked structure where an Si layer is formed on a first Si—Ge layer on the silicon substrate exposed in the groove on the NMOSFET region but also a second Si—Ge layer on the silicon substrate exposed in the groove on the PMOSFET region; the step of forming a gate insulating film on the exposed Si layer and Si—Ge layer; and the step of forming a gate electrode made of metallic material in the groove.

Preferred modes of the method for manufacturing the semiconductor device are as follows:

(a) The stacked structure of the first Si—Ge layer and Si layer on the NMOSFET side is formed by selectively introducing Ge into the silicon substrate exposed in the groove on the NMOSFET region and thereby forming the first Si—Ge layer in the region excluding the surface of the substrate, and the second Si—Ge layer on the PMOSFET side is formed by selectively introducing Ge into the surface of the silicon substrate exposed in the groove on the PMOSFET region.

(b) The step of forming a stacked structure of the first Si—Ge layer and Si layer on the NMOSFET side and a second Si—Ge layer on the PMOSFET side includes the step of selectively introducing Ge into the silicon substrate exposed in the groove on the NMOSFET region and PMOSFET region and thereby forming the first Si—Ge layer and second Si—Ge layer on the silicon substrate on the NMOSFET side and PMOSFET side, respectively, and the step of selectively growing an Si layer epitaxially at the surface of the first Si—Ge layer.

(c) The step of forming a stacked structure of the first Si—Ge layer and Si layer on the NMOSFET side and a second Si—Ge layer on the PMOSFET side includes the step of selectively growing epitaxially an Si—Ge layer on the silicon substrate exposed in the groove on the NMOSFET section side and PMOSFET side and thereby forming the first Si—Ge layer and second Si—Ge layer on the silicon substrate on the NMOSFET side and PMOSFET side, respectively, and the step of selectively growing an Si layer epitaxially on the surface of the first Si—Ge layer on the NMOSFET side.

A method of manufacturing semiconductor devices according to the present invention comprising: the step of forming a dummy gate in the gate formation region in each of an NMOSFET and a PMOSFET formed in a silicon substrate having an Si—Ge layer at its surface; the step of selectively introducing impurities into the PMOSFET section and NMOSFET section at the surface of the substrate with the dummy gates as masks and heating the impurity-introduced portions to form diffused layers serving as the sources and drains of the NMOSFET and PMOSFET; the step of forming an insulating film on the silicon substrate in such a manner that the film covers the dummy gates; the step of flattening the surface of the insulating film and exposing the top surface of the dummy gates; the step of removing the dummy gates and making a groove; the step of exposing the Si—Ge layer at the bottom of the groove on the NMOSFET section side; the step of selectively growing a silicon layer epitaxially on the Si—Ge layer exposed at the bottom of the groove on the NMOSFET section side; the step of exposing the Si—Ge layer at the bottom of the groove on the PMOSFET section side; the step of forming a gate insulating film on the Si layer on the NMOSFET section side and on the Si—Ge layer on the PMOSFET section side; and the step of forming a gate electrode made of metallic material in the groove.

With the above configuration, the present invention produces the following effects.

Since the gate electrode of the FET is made of metallic material, a part of the channel layer is formed as Si—Ge layer and the concentration of Ge in the channel layer of the NMOSFET is lower than that in the PMOSFET, the difference between the conduction band of the channel layer of the NMOSFET and the Fermi level of the gate electrode and the difference between the valence band of the channel layer of the PMOSFET and the Fermi level of the gate electrode are small. This helps prevent the threshold voltage from rising. In addition, a high-mobility, high-gate-breakdown-voltage metal (TiN) gate CMOS transistor can be realized using a simple manufacturing process including the dummy-gate process.

A low-threshold-voltage transistor using metal (TiN) gates for both an NMOS and a PMOS can be realized easily. The mobility of carriers is improved in both the NMOS and PMOS. The mobility of electrons is three to five times as high as and the mobility of holes is four to six times as high as that in an ordinary Si substrate.

Use of the metal gate prevents depletion from occurring in the gate and makes the effective thickness of the gate insulting film thinner. In addition, there is no delay in the wiring of the gate. Thus, a higher performance transistor can be formed. Moreover, since an NMOS gate and a PMOS gate need not be formed selectively, the number of manufacturing processes can be decreased.

Using the dummy gate process and Si or Si—Ge epitaxial growth techniques or Ge ion implantation techniques makes it easy to selectively form an NMOS channel layer (e.g., a tensile-strained Si layer) and a PMOS channel layer (e.g., an Si—Ge layer).

Use of the dummy gate process makes it possible to eliminate a heating process carried out at temperatures higher than 600° C. after the formation of the Si—Ge channel layer. This suppresses the occurrence of misfit dislocation at the Si—Ge/Si interface or the segregation of Ge, which improves the gate breakdown voltage characteristic.

In the FET formed on the SOI substrate, by setting the Ge concentration at the under portion of the channel Si layer be lower than the Ge concentration of the source, the bandgap on the source side becomes smaller than the bandgap on the channel layer side and the holes accumulated in the Si—Ge layer (near the source) under the channel layer are drawn into the source. This suppresses the floating body effect.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a sectional view showing the configuration of an NMOSFET in a CMOSFET according to a first embodiment of the present invention;

FIG. 1B is a sectional view showing the configuration of a PMOSFET in the CMOSFET according to the first embodiment;

FIG. 8A is a sectional view showing the configuration of an NMOSFET in a CMOSFET according to a second embodiment of the present invention;

FIG. 8B is a sectional view showing the configuration of a PMOSFET in the CMOSFET according to the second embodiment;

DETAILED DESCRIPTION OF THE INVENTION

Figure 2:
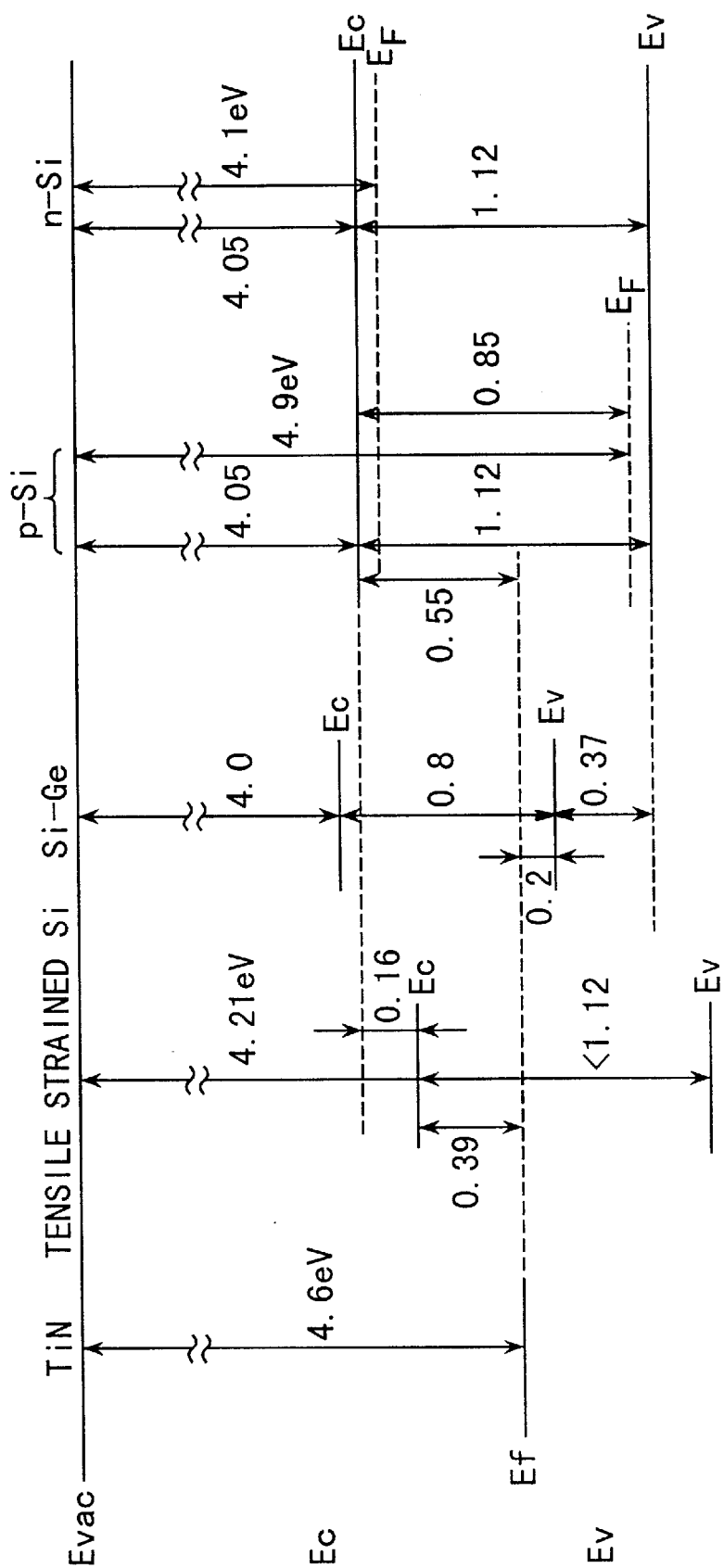
FIG. 2 shows the values of the work function and the values of the bandgap for the gate material and channel material.

Hereinafter, embodiments of the present invention will be explained by reference to the accompanying drawings.

First Embodiment

FIG. 1A is a sectional view showing the configuration of an NMOSFET in a CMOSFET according to a first embodiment of the present invention and FIG. 1B is a sectional view showing the configuration of a PMOSFET in the CMOSFET according to the first embodiment.

First, the configuration of the NMOS section of the CMOSFET will be explained. AS shown in FIG. 1A, an Si—Ge layer 12 is formed in an Si substrate 10 in such a manner that it is sandwiched between n⁺ diffused layers 11 acting as the source or drain of a transistor. At the surface of the Si—Ge layer 12, a tensile-strained Si channel layer 13 is formed. On the surface of the n⁺ diffused layer 11, an $SiO_2$ insulating film 14 with an groove above the tensile-strained Si channel layer 13 is formed. On the bottom surface and sidewall of the groove, a $Ta_2O_5$ film 15 acting as a gate insulating film and a TiN film 16, which is part of a gate electrode, are stacked one on top of the other in that order. Then, an Al gate electrode 17 is formed in such a manner that it is embedded in the groove.

The configuration of the PMOSFET section of the CMOSFET will be explained. As shown in FIG. 1B, a compressive-strained Si—Ge channel layer 19 is formed at the surface of the Si substrate 10 in such a manner that it is sandwiched between p⁺ diffused layers 18 acting as the source or drain of a transistor. On the surface of the p⁺ diffused layers 18, the $SiO_2$ insulating film 14 with an groove above the compressive-strained Si—Ge channel layer 19 is formed. On the bottom surface and sidewall of the groove in the $SiO_2$ insulating film 14, the $Ta_2O_5$ film 15 and the TiN film 16 are stacked one on top of the other in that order. Then, the Al gate electrode 17 is formed in such a manner that it is embedded in the groove.

FIG. 2 shows the values of the work function and the values of the bandgap for the gate material and channel material. In FIG. 2, $E_{vac}$ is the vacuum level, $E_c$ is the conduction band level, $E_v$ is the valence band level, and $E_f$ is the Fermi level energy. The work function is the difference in energy between $E_{vac}$ and $E_f$. As seen from FIG. 2, the Fermi level of TiN is near the midpoint of the bandgap of silicon. Thus, when a TiN gate is used at the surface of an ordinary silicon substrate, the threshold values (absolute values) of both of the NMOS and PMOS transistors are larger than when a polysilicon gate is used (the former is larger than the latter by about 0.4 to 0.5v).

In contrast, when a metal (Al/TiN) gate and a tensile-strained Si channel layer are used in the NMOS transistor and a metal (Al/TiN) gate and a compressive-strained Si—Ge channel layer are used in the PMOS transistor, the threshold voltages of both of the NMOS and PMOS transistors lower (by about 0.2V or more), which makes threshold voltage adjustment easier.

The reason will be explained using FIGS. 3A to 3C and FIGS. 4A to 4C. FIGS. 3A to 3C and FIGS. 4A to 4C show band structures when the materials shown in FIG. 2 are joined via a gate insulating film.

Figures 3A, 4A:
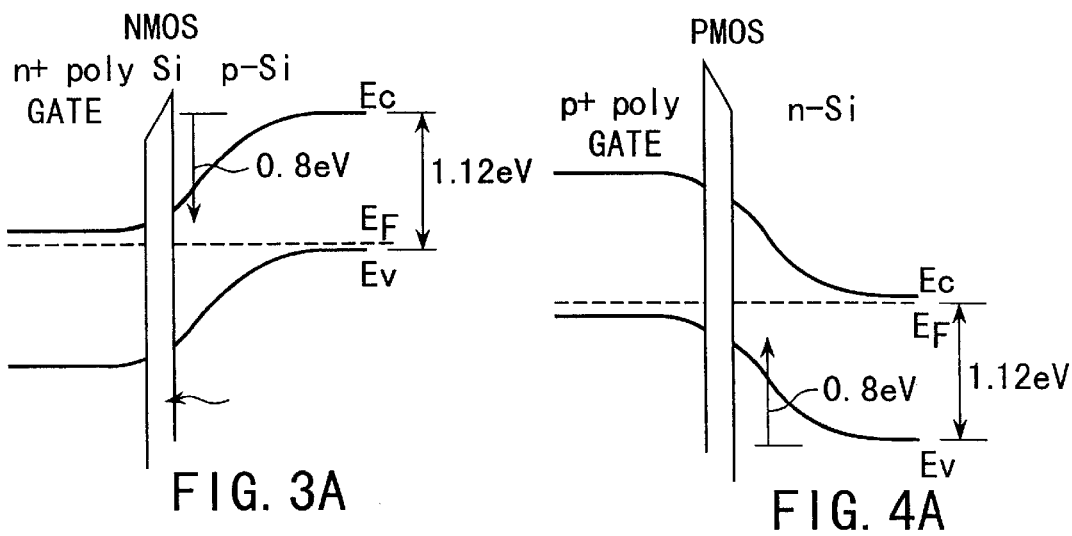
FIGS. 3A to 3C show the band structure when the materials shown in FIG. 2 are joined via a gate insulating film.
FIGS. 4A to 4C show the band structure when the materials shown in FIG. 2 are joined via a gate insulating film.
Figures 3B, 4B:
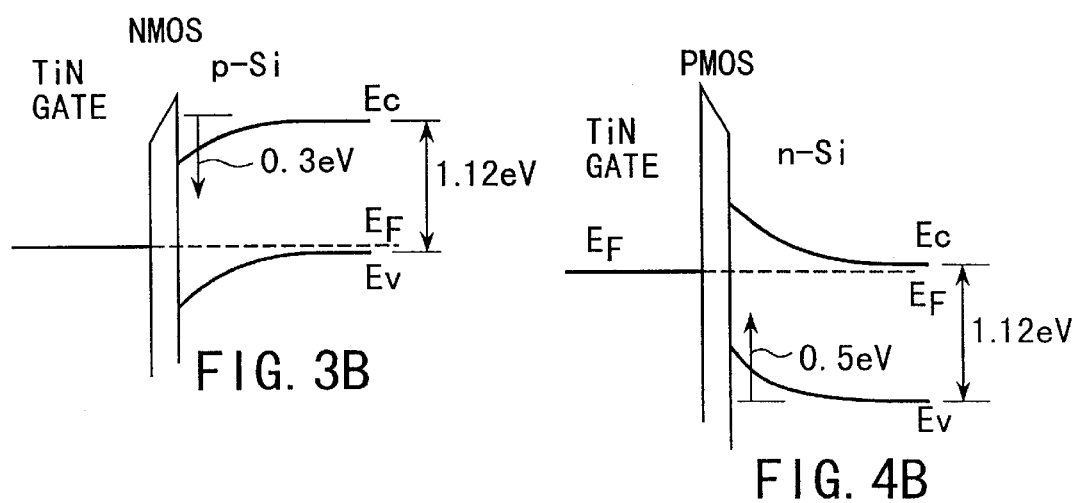

Joining two types of materials makes the band near the junction interface bend so that the Fermi level of one may coincide with that of the other. First, consider the NMOS transistor. Conventionally, since an $n^+$ polysilicon gate was formed via a gate insulating film above a p-type Si as shown in FIG. 3A, the amount of bend in the band at the surface of the p-type Si channel layer was, for example, about 0.8 eV. When a TiN gate was formed on the p-type Si, the amount of bend in the band at the surface of the channel layer was about 0.3 eV as sown in FIG. 3B. As a result, the threshold voltage of FIG. 3B is higher than that of FIG. 3A by about 0.5 eV. In contrast, when a TiN gate is formed via a gate insulating film above a p-type tensile-strained Si channel layer as shown in FIG. 3C, the threshold value can be made smaller than that of FIG. 3B, because the amount of bend in the band is about 0.46 eV.

Now, consider the PMOS transistor. Conventionally, since a $p^+$ polysilicon gate was formed via a gate insulating film above an n-type Si as shown in FIG. 4A, the amount of bend in the band at the surface of the n-type Si channel layer was about 0.8 eV. When a TiN gate was formed via a gate insulating film above the n-type Si, the amount of bend in the band at the surface of the channel layer was about 0.5 eV as shown in FIG. 4B. As a result, the threshold voltage (absolute value) of FIG. 4B is higher than that of FIG. 4A by about 0.3 to 0.4 eV.

Figures 3C, 4C:
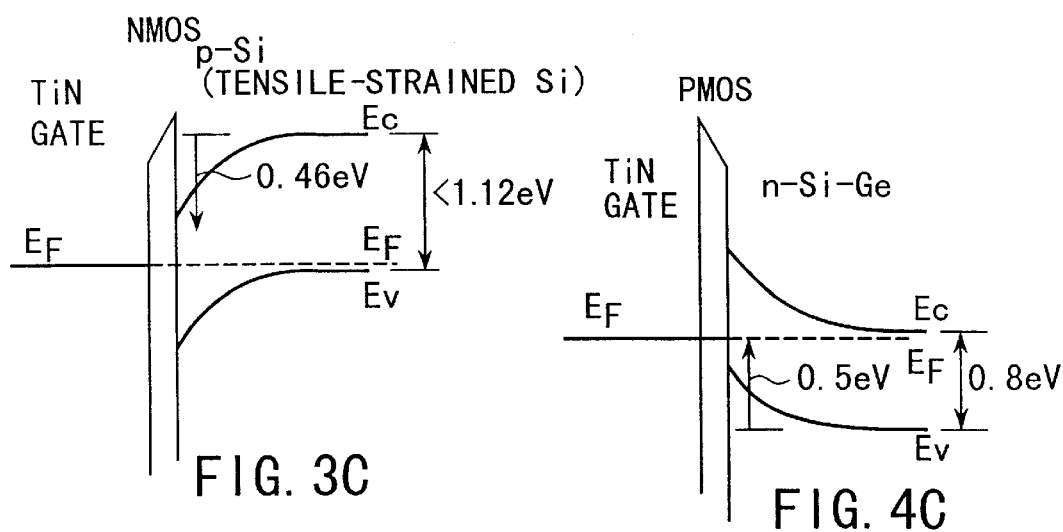

In contrast, when a TiN gate is formed via a gate insulating film above an n-type compressive-strained Si—Ge channel layer as shown in FIG. 4C, the threshold value can be made smaller than that of FIG. 4B (another slight bend to the Si—Ge band would produce an inversion layer), because the bandgap of Si—Ge is as small as 0.8 eV, although the amount of bend in the band is about 0.5 eV as in FIG. 4C.

Consequently, to realize a low threshold voltage, it is desirable that a tensile-strained Si channel layer should be used in the NMOS transistor and a compressive-strained Si—Ge channel layer should be used in the PMOS transistor.

When an attempt is made to adjust the threshold voltage to a low level in an ordinary Si channel layer, it is necessary to make the concentration of impurities at the surface of the substrate very low or implant counter-channel ions. Thus, the inevitable result is a structure easily affected by the short channel effect or an buried-channel MOSFET structure.

Here, a desirable composition of the Si—Ge layer ($Si_{1-x}Ge_x$) will be explained. In general, it is known that, as the content of Ge increases, the effective mass $m_h$ of holes decreases (the approximate equation $m_h$=a−b×x holds, where a and b are constants). In addition, as the content of Ge increases, the mobility of electrons in the tensile-strained Si channel layer formed on Si—Ge also increases. For this reason, the content of Ge should be increased, but an increase in the Ge content permits dislocation to take place at the interface with Si as shown in FIG. 5, thinning the critical film thickness $h_c$ of the Si—Ge layer.

Figure 5:
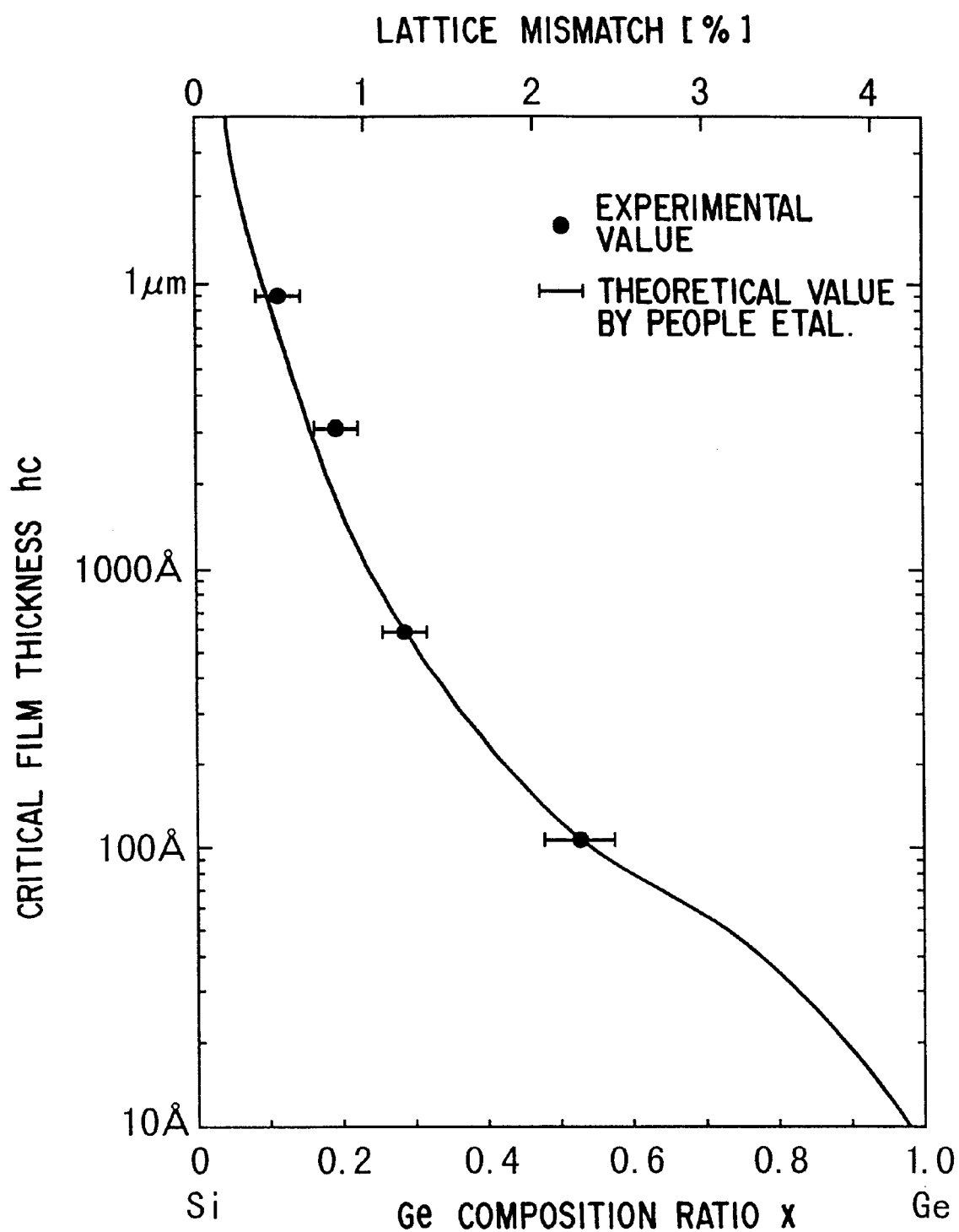
FIG. 5 shows theoretical values and experimental values of the critical film thickness $h_c$ of the Si—Ge layer.

FIG. 5 shows the theoretical values (represented by a solid line) and experimental values (represented by the mark ●) of the critical film thickness $h_c$ of the Si—Ge layer. The theoretical values were calculated using the following equation advocated by People, et al.:

$$h_c \approx \left(\frac{1-v}{1+v}\right)\left(\frac{1}{16\pi\sqrt{2}}\right)\left(\frac{b^2}{a}\right)\left[\left(\frac{1}{\varepsilon^2}\right)\ln\left(\frac{h_c}{b}\right)\right] \quad (1)$$

where v is Poisson's ratio, a is the lattice constant of the Si—Ge layer, b is Burger's vector, and ε strain.

Equation (1) was obtained from the idea that when the energy $E_M$ of strain becomes equal to the energy $E_D$ of dislocation, the system will permit the dislocation to release a strain, and the film thickness at that time is the critical film thickness $h_c$.

FIG. 5 shows the result of calculations made when the lattice constant a is approximated by an average value of 5.54Å and Burger's vector is assumed to be 4Å.

In FIG. 5, for example, when x=0.5, the critical film thickness of the Si—Ge layer is about 10 nm (or thickness of the Si—Ge layer must be 10 nm or less). Since the thickness of the channel inversion layer is about 1 to 2 nm, the lower limit of the film thickness of the Si—Ge channel layer is about 2 nm. As shown in FIG. 5, x at which the critical film thickness is 2 nm is 0.9. Thus, the upper limit of x is 0.9.

When the concentration of Ge is low, the carrier mobility in the channel layer is improved less. Thus, the lower limit of the Si—Ge layer ($Si_{1-x}Ge_x$) is 0.1.

Next, a desirable film thickness of the Si—Ge layer will be explained. With a structure where the Ge composition ratio x is changed (increased) gradually from the support substrate side, the stress is alleviated, making dislocation less liable to occur, which makes it possible to thicken the Si—Ge layer to a thickness of 2 to 3 μm. When x cannot be changed gradually, however, the Si—Ge layer thickness must be suppressed below the critical film thickness at which the defect occurs as described above. In this case, the lower limit of the thickness of the Si—Ge channel must be adjusted by about 2 nm, because the thickness of the channel inversion layer is about 1 to 2 nm.

Next, a desirable film thickness of the tensile-strained Si layer on the Si—Ge layer will be explained. Since the thickness of the channel inversion layer is about 1 to 2 nm, the lower limit of the thickness of the tensile-strained Si channel layer is about 2 nm. The experiments have shown that, as the thickness of the tensile-strained channel layer was increased, the mobility decreased and misfit dislocation occurred at about 30 nm. Thus, the upper limit of the thickness of the tensile-strained Si channel layer is about 30 nm.

Figure 6A:
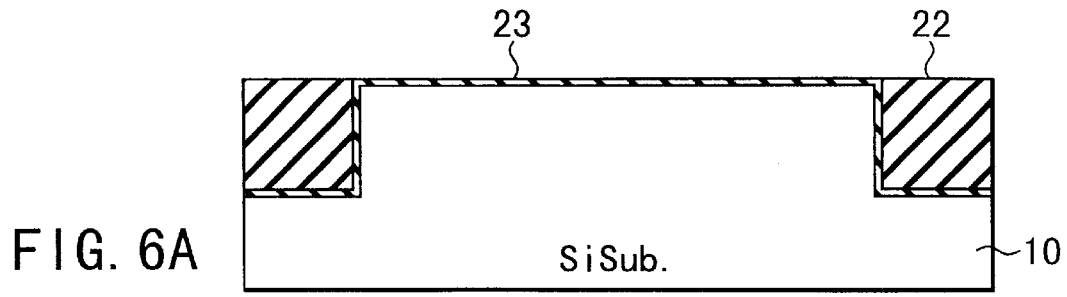
FIGS. 6A to 6P are sectional views to help explain the process of manufacturing the NMOSFET shown in FIG. 1A.

Now, the process of manufacturing a CMOSFET to which the basic configuration of the CMOSFET shown in FIGS. 1A and 1B has been applied will be explained. FIGS. 6A to 6P are sectional views to help explain the process of manufacturing the NMOSFET shown in FIG. 1A. FIGS. 7A to 7L are sectional views to help explain the process of manufacturing the PMOSFET shown in FIG. 1B.

Figure 7A:
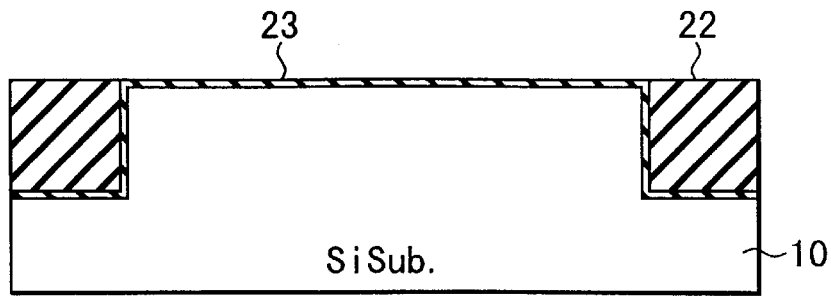
FIGS. 7A to 7L are sectional views to help explain the process of manufacturing the PMOSFET shown in FIG. 1B.

First, as shown in FIGS. 6A and 7A, a groove with a depth of about 200 nm is made in the surface of an device isolating region of a silicon substrate 10 of, for example, (100) surface orientation. After the inner wall is oxidized slightly to form a thermal oxidation layer, an device isolation insulating film 22 made of, for example, a TEOS oxide film is buried, thereby forming a trench isolation (STI: Shallow Trench Isolation). If necessary, ions for forming well or channel layers are implanted hire, and a thermal oxidation film 23 of about 6 nm thick is formed at the surface of the substrate.

Figure 6B:
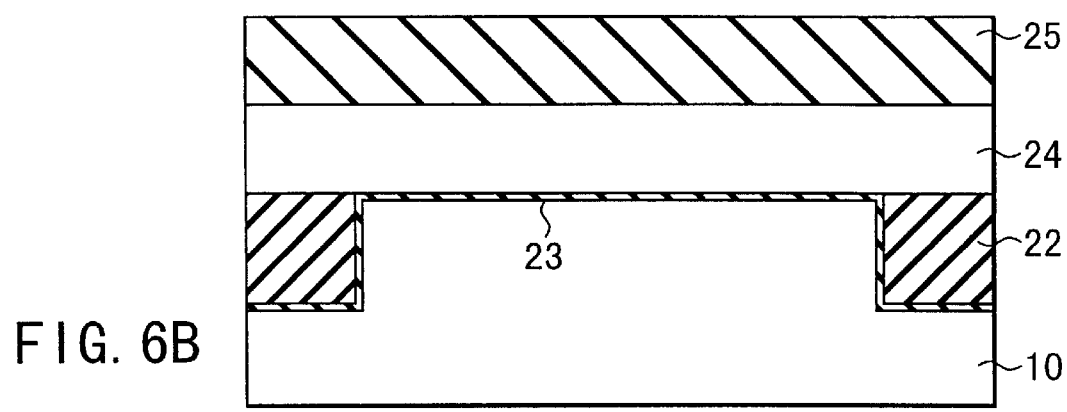
Figure 7B:
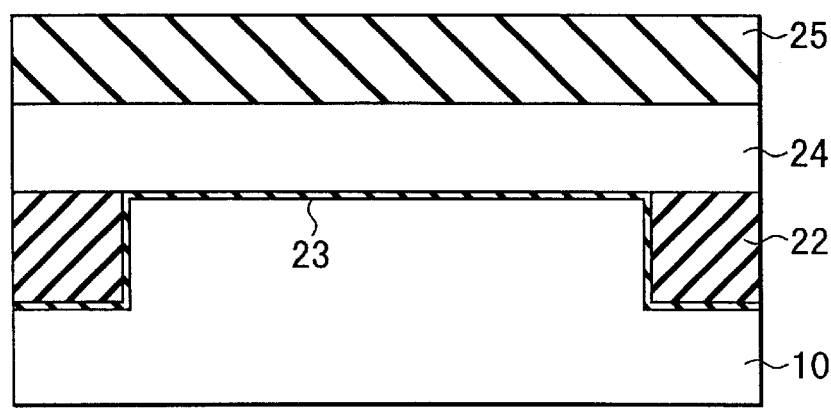

Next, as shown in FIGS. 6B and 7B, as dummy gate material, a polysilicon film 24 and a silicon nitride film 25 are both formed by deposition to a thickness of about 150 nm using LPCVD techniques.

Figure 6C:
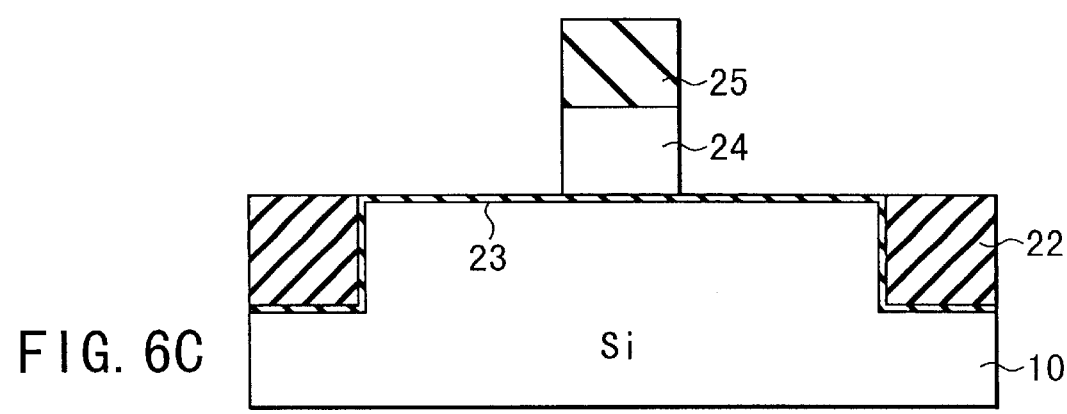
Figure 7C:
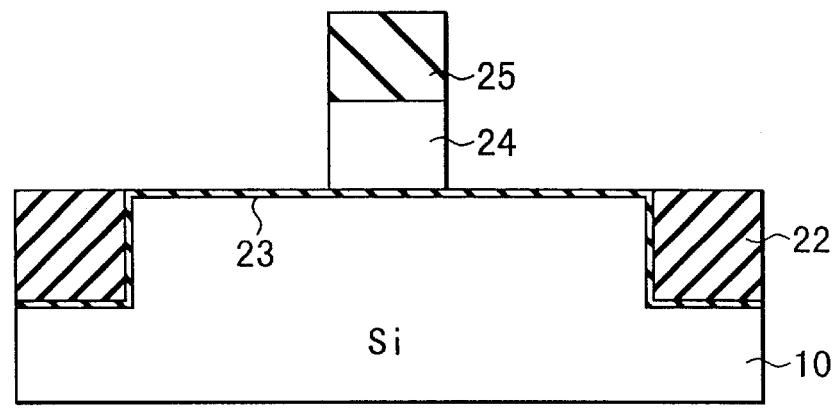

Then, as shown in FIGS. 6C and 7C, using photolithography or EB lithography, a resist pattern (not shown) is formed in a gate formation planned region. With the resist pattern as a mask, the silicon nitride film 25 and polysilicon film 24 excluding the gate formation planned region are etched away by RIE techniques and then the resist pattern is removed. Here, the polysilicon film 24 becomes a dummy gate, which will be removed later.

Figure 6D:
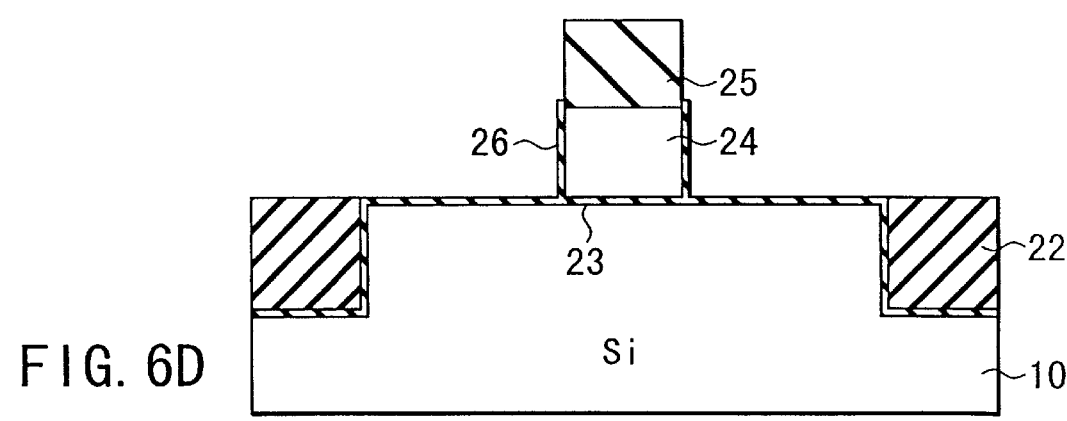
Figure 7D:
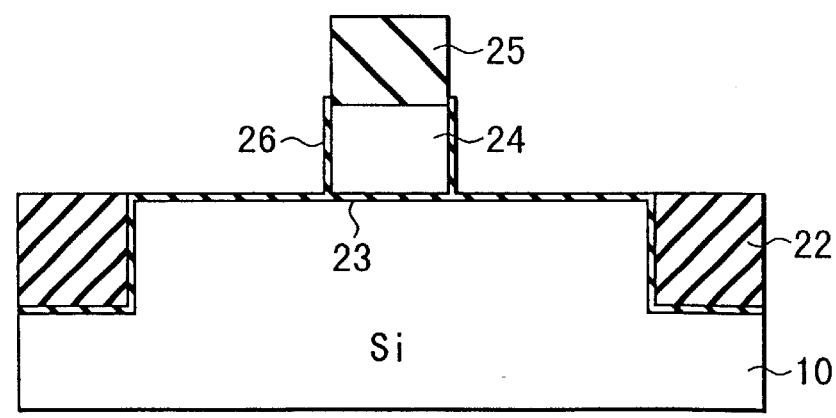

Next, as shown in FIGS. 6D and 7D, an oxide film 26 is formed on the sidewall of the polysilicon film 24 by thermal oxidation.

Figure 6E:
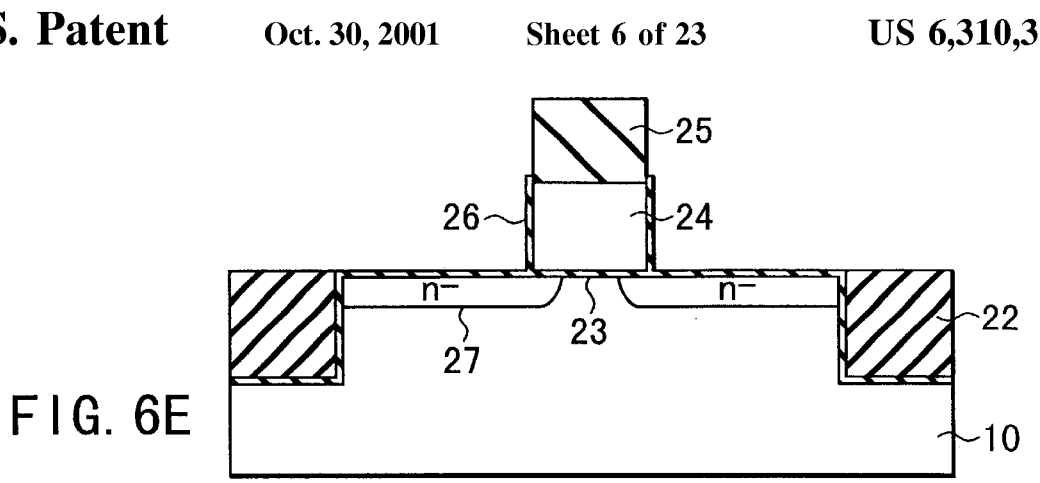
Figure 7E:
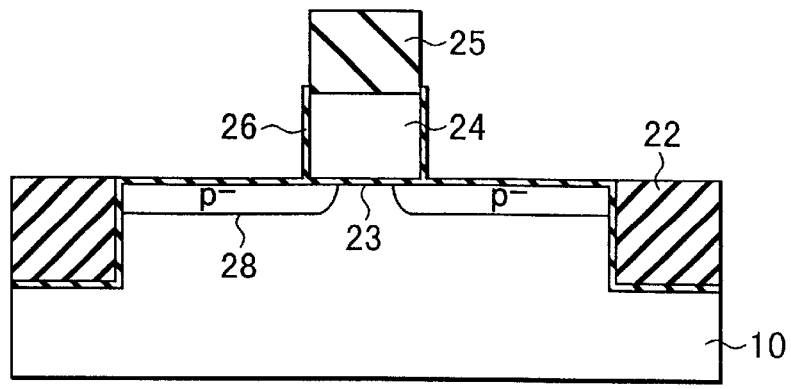

Then, as shown in FIG. 6E, after the PMOSFET section is covered with a resist film, an n⁻ diffused layer 27 is selectively formed at the NMOSFET section and the resist film is removed. As shown in FIG. 7E, after the NMOSFET section is covered with a resist film, ions are implanted into the PMOSFET section to form a p⁻ diffused layer 28 and the resist film is removed. The order in which the n⁻ diffused layer 27 and p⁻ diffused layer 28 are formed may be selected arbitrarily.

The n⁻ diffused layer 27 is formed by implanting, for example, As ions at a dose of about $3 \times 10^{14} cm^{-2}$ at an acceleration voltage of 15 keV. The p⁻ diffused layer 28 is formed by implanting, for example, Ge ions at a dose of about $5 \times 10^{14} cm^{-2}$ at an acceleration voltage of 15 keV to make the Si substrate amorphous and then implanting $BF_2$ ions at a dose of about $5 \times 10^{14} cm^{-2}$ at an acceleration voltage of 10 keV.

Figure 6F:
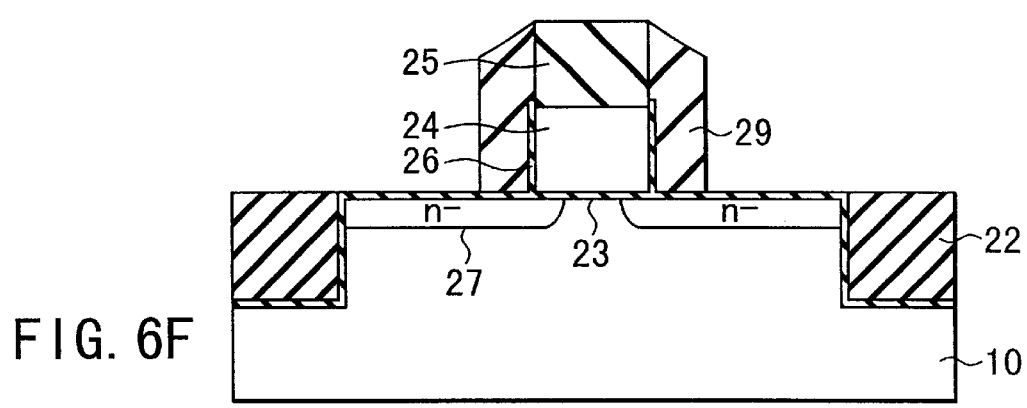
Figure 7F:
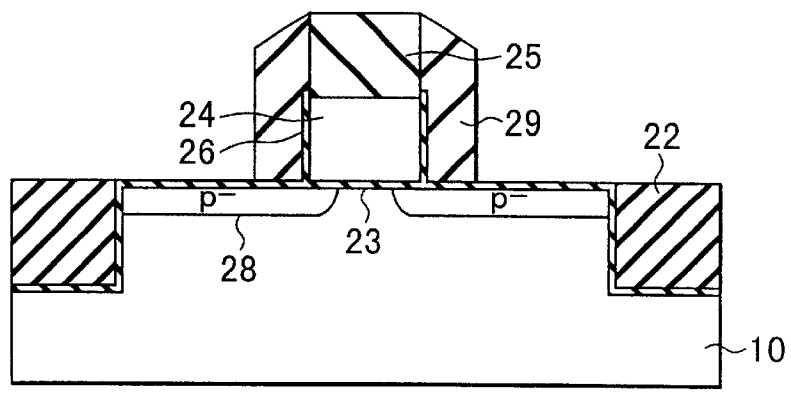

Then, as shown in FIGS. 6F and 7F, after a silicon nitride film is formed by deposition to a thickness of about 70 nm, the entire surface is subjected to RIE, thereby forming a sidewall insulating film 29 on the sidewalls of the polysilicon film 24 and silicon nitride film 25 serving as dummy gates.

Figure 6G:
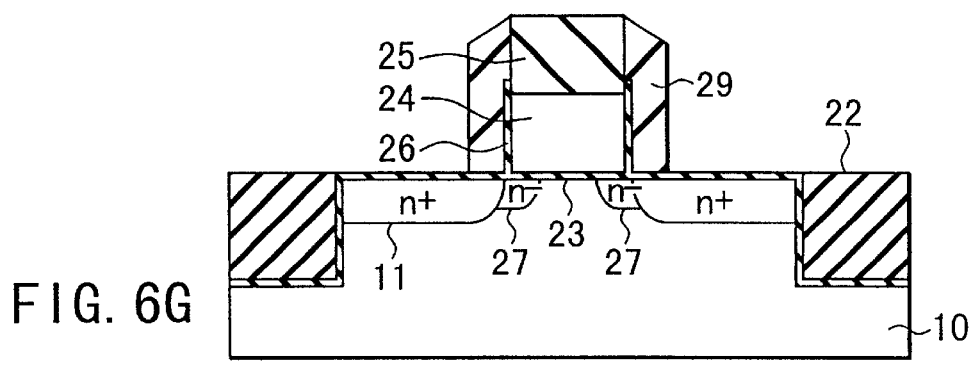
Figure 7G:
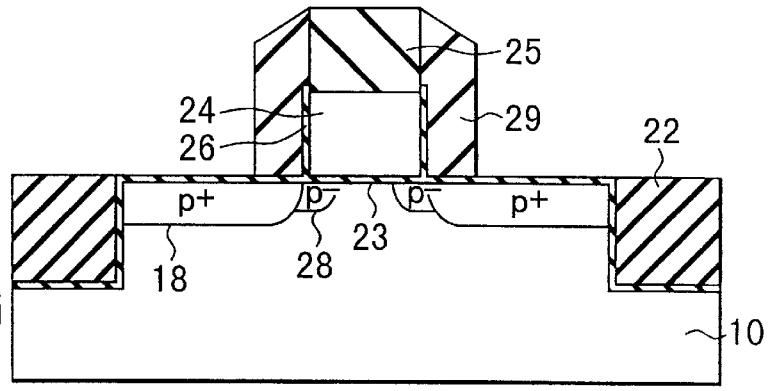
Figure 7H:
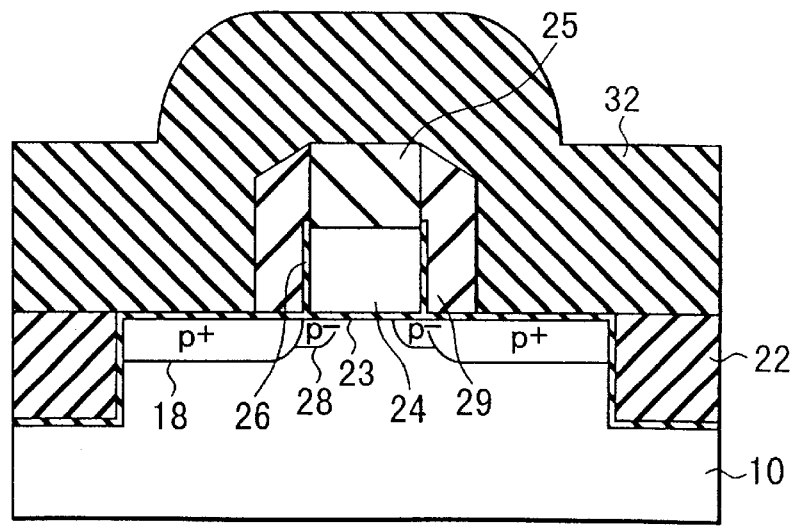

Next, as shown in FIG. 6G, after the PMOSFET section is covered with a resist film, an n⁺ diffused layer 11 is selectively formed in the NMOSFET section and then the resist film is removed. As shown in FIG. 7G, after the NMOSFET section is covered with a resist film, ions are implanted in the PMOSFET section to form a p⁺ diffused layer 18 and then the resist film is removed. The order in which the n⁺ diffused layer 11 and p⁺ diffused layer 18 are formed may be selected arbitrarily.

The n⁺ diffused layer 11 is formed by implanting, for example, As ions at a dose of about $3 \times 10^{15} cm^{-2}$ at an acceleration voltage of 45 keV. The p⁺ diffused layer 18 is formed by implanting $BF_2$ ions at a dose of about $4 \times 10^5 cm^{-2}$ at an acceleration voltage of 35 keV. The activation annealing of the n⁺, n⁻, p⁺, and p⁻ diffused layers serving as the sources and drains may be done immediately after each ion implantation or at the same time after all the ions have been implanted.

Figure 6H:
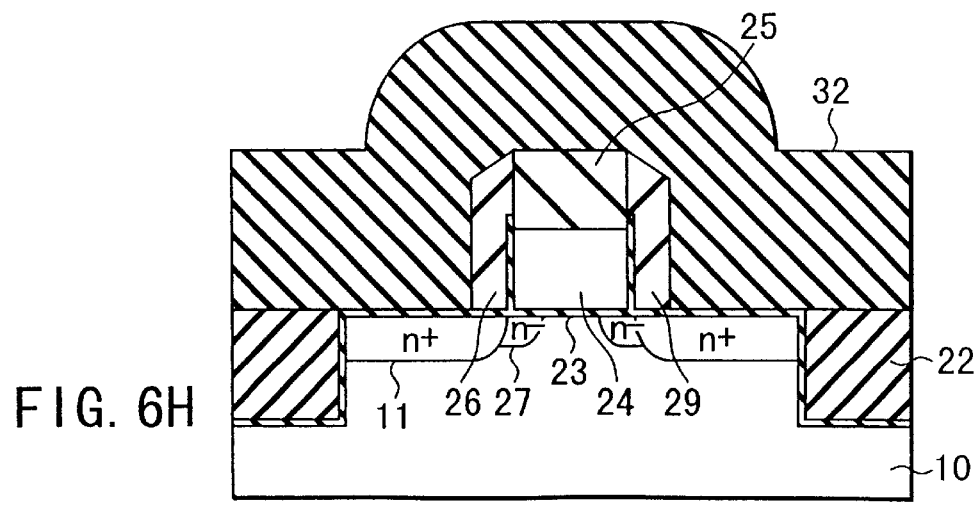
Figure 6I:
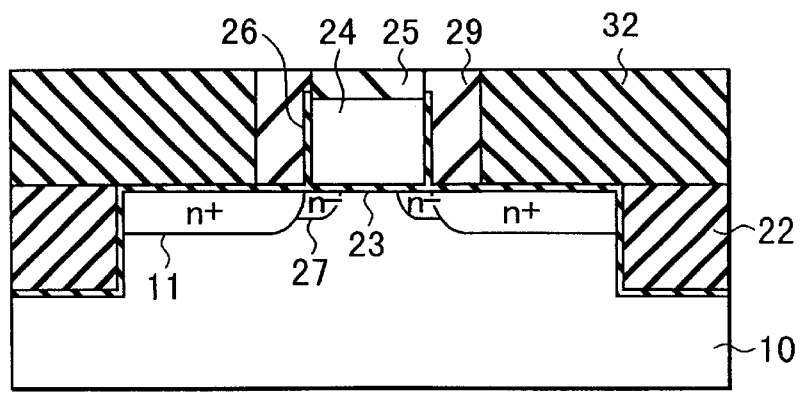
Figure 7I:
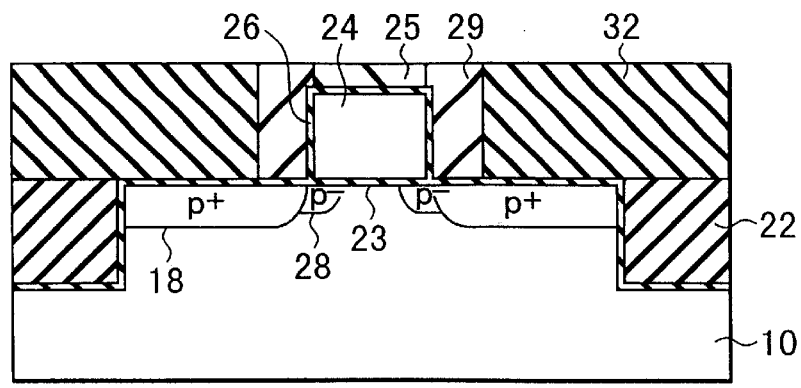

Next, after a TEOS oxide film 32 is deposited all over the surface by LPCVD techniques to a thickness of about 350 nm (FIG. 6H and FIG. 7H), the surface of the TEOS oxide film 32 is flattened by using CMP (Chemical Mechanical Polishing) techniques (FIGS. 6I and 7I). At this time, the silicon nitride film 25 and a sidewall insulating film 29 composed of a silicon nitride film function as a stopper.

Figure 6J:
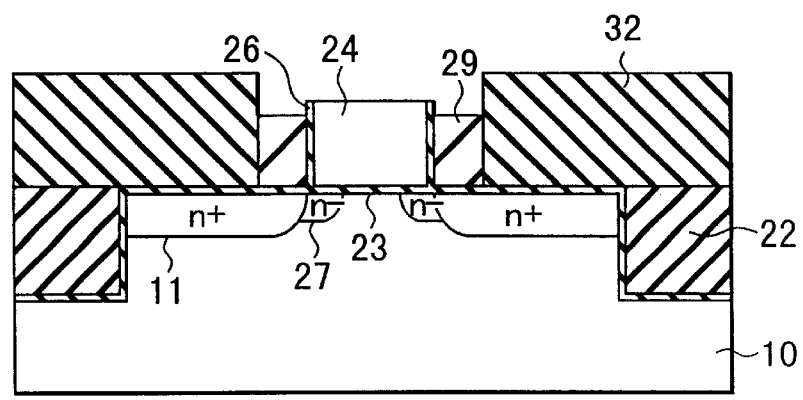
Figure 7J:
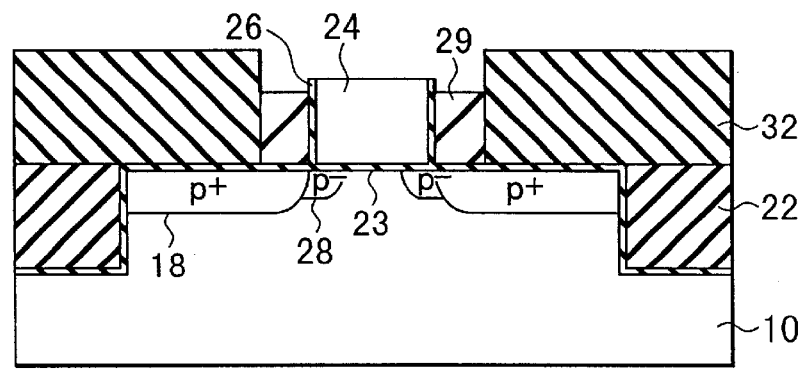

Next, as shown in FIGS. 6J and 7J, the silicon nitride film 25 of the dummy gate is removed using hot phosphoric acid. At this time, the top of the sidewall insulating film 29 composed of a silicon nitride film is also etched, with the result that the height of the sidewall insulating film 29 decreases a little.

Figure 6K:
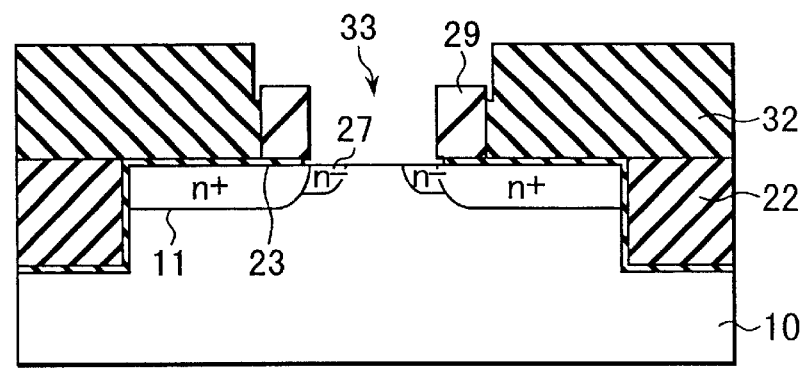
Figure 7K:
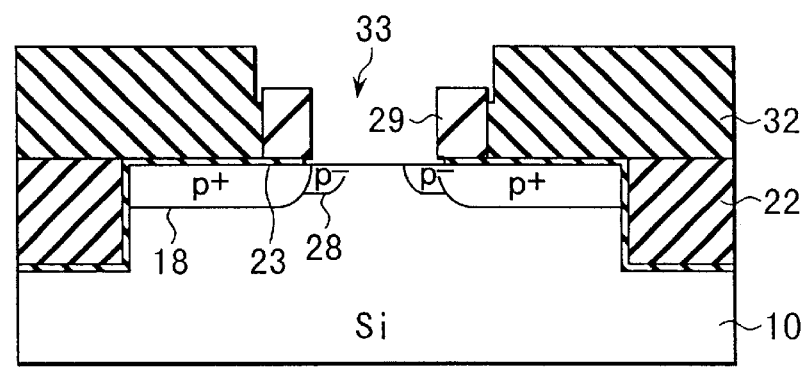

Furthermore, as shown in FIGS. 6K and 7K, after the polysilicon film 24 serving as a dummy gate is removed by CDE techniques, wet etching is done by HF and the thermal oxidation film 23 is removed, thereby forming an groove 33 in a region in which a gate electrode is to be formed.

Figure 6L:
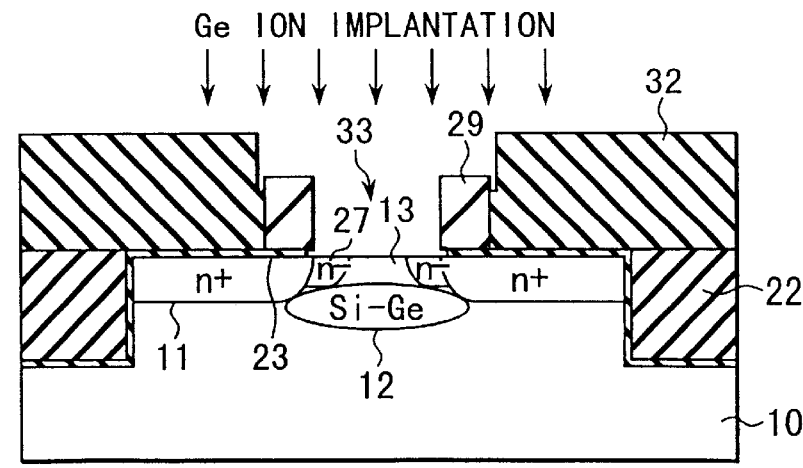

Then, as shown in FIG. 6L, after a resist film is formed at the surface of the PMOSFET section, Ge ions are implanted somewhat deeply at an projected range of Rp=about 60 nm or less at an acceleration voltage of 100 kev to form a first Si—Ge layer 12 in the silicon substrate 10 and then the resist film is removed. The Si substrate 1 on the Si—Ge layer 12 turns into the tensile-strained Si channel layer 13 because of the presence of the Si—Se layer.

Figure 7L:
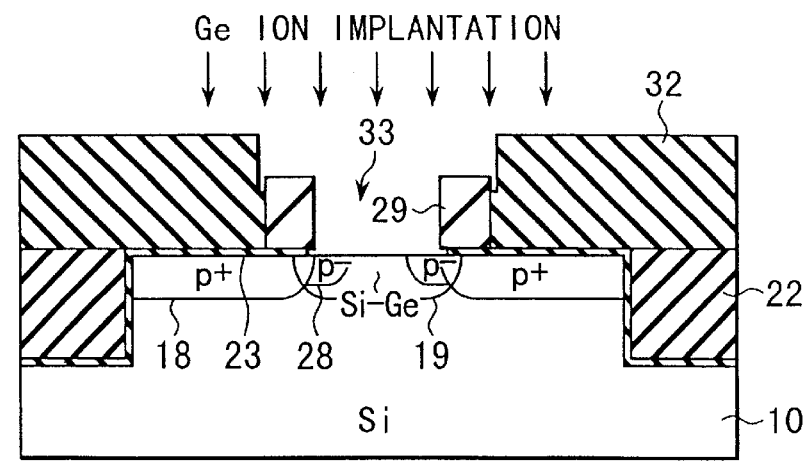

Then, as shown in FIG. 7L, after a resist film is formed at the surface of the NMOSFET section, Ge ions are implanted shallowly at an projected range of Rp=about 30 nm or less at an acceleration voltage of 45 keV to form an Si—Ge layer 19 at the surface of the substrate and then the resist film is removed.

As described above, it is easy to selectively form the NMOS channel layer or PMOS channel layer. The order in which the tensile-strained Si channel layer 13 and Si—Ge cannel layer 19 are formed may be selected arbitrarily.

While the maximum concentration of Ge in the Si—Ge layers 12, 19 is set to about $1 \times 10^{22} cm^{-3}$ (10 atoms %) during ion implantation, the Ge composition ratio in the Si substrate may be increased further.

Since the thickness of the channel inversion layer is about 2 nm, it is desirable that the thickness of the tensile-strained Si channel layer 13 should be about 2 nm to 30 nm. The thickness of the Si—Ge layers 12, 19 can be set in the wider range of about 30 or 40 nm to 1 μm. To alleviate stress, it is desirable that the thickness of the Si—Ge layer should be kept at about 2 nm to 2 to 3 μm, while the Ge composition ratio is being changed.

Next, a gate insulating film and a gate electrode are formed. Since the source and drain have been formed (including activation) and basically there is no high-temperature process higher than 600° C. or more thereafter, neither misfit dislocation nor Ge-segregation takes place, improving the gate breakdown voltage. Because post-treatment is carried out at low temperatures, high dielectric films or ferroelectric films, such as a $Ta_2O_5$ film, a $TiO_2$ film, or $(Ba, Sr)TiO_3$ may be used for the gate insulating film and metal material may be used for the gate electrode. When a high dielectric film or a ferroelectric film is used as the gate insulating film, it is necessary to select a gate electrode material according to the gate insulating film used. In this case, TiN, Al, W, or Ru may be used.

Furthermore, it is desirable that TiN, WN or the like should be formed as barrier metal between the gate insulating film and the gate electrode material. The barrier metal, which has a thickness of 5 to 10 nm, serves as a barrier that prevents Al from diffusing from the Al electrode into the gate insulating film. Hereinafter, a manufacturing method using a $Ta_2O_5$ film as the gate insulating film and a stacked structure of the aluminum formed by sputtering techniques and the TiN formed by CVD techniques as the gate electrode will be explained.

Figure 6M:
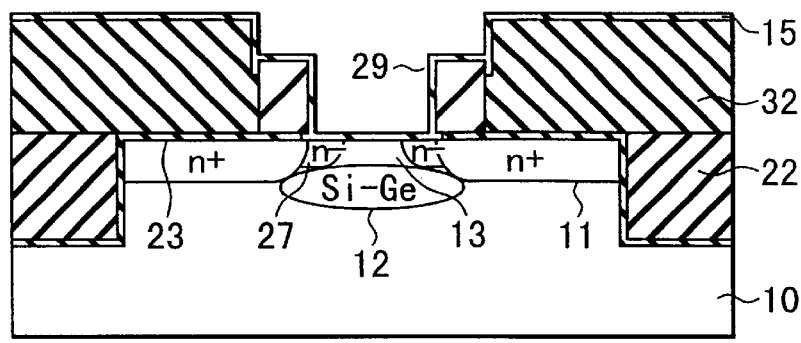

The gate insulating film is formed as follows. For example, oxygen radical is projected on the surface of the substrate 10 to form an $SiO_2$ layer to a thickness of about 0.2 to 0.3 nm (not shown), followed by the formation of an SiN layer using ammonia, silane, or the like to a thickness of about 1.2 nm (not shown). The 1.2-nm-thick SiN layer has a $SiO_2$ equivalent film thickness of about 0.6 nm and a permittivity of about 7.5. As shown in FIGS. 6M and 7M, the $Ta_2O_5$ film 15 is formed on the SiN layer (not shown) to a thickness of about 5 nm by CVD techniques. The nearly 5-nm-thick $Ta_2O_5$ film 15 has a $SiO_2$ equivalent film thickness of about 1 nm and a permittivity of about 20. As a result of forming those films this way, the film thickness of the insulating film is 2 nm or less in $SiO_2$ equivalent film thickness.

Another method of forming a gate insulating film is to form a nearly 1-nm-thick thermal oxidation $SiO_2$ film first and nitride (N2 plasma nitridation) the surface using nitrogen radical at low temperatures (600° C. or below). When the SiN layer is formed to a thickness of about 1.4 nm (0.7 nm in $SiO_2$ equivalent film thickness), the remaining $SiO_2$ layer has a thickness of about 0.3 nm. After the $Ta_2O_5$ film 15 is formed to a thickness of about 5 nm (1 nm in $SiO_2$ equivalent film thickness) by CVD techniques, the thickness of the gate insulating film is 2 nm or less in the $SiO_2$ equivalent film thickness.

Figure 6N:
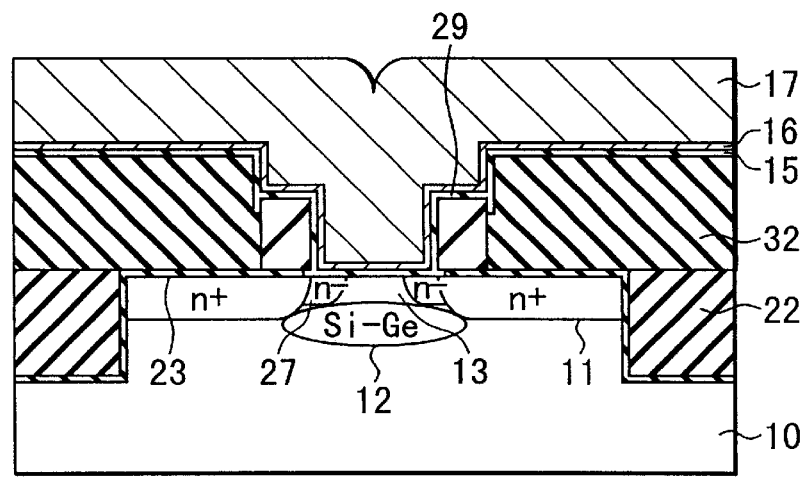
Figure 6O:
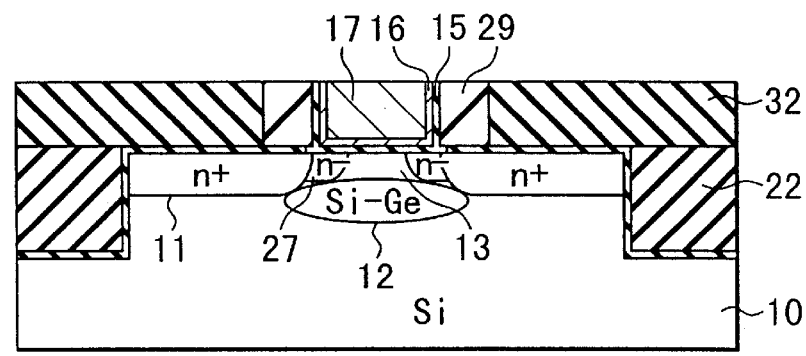
Figure 6P:
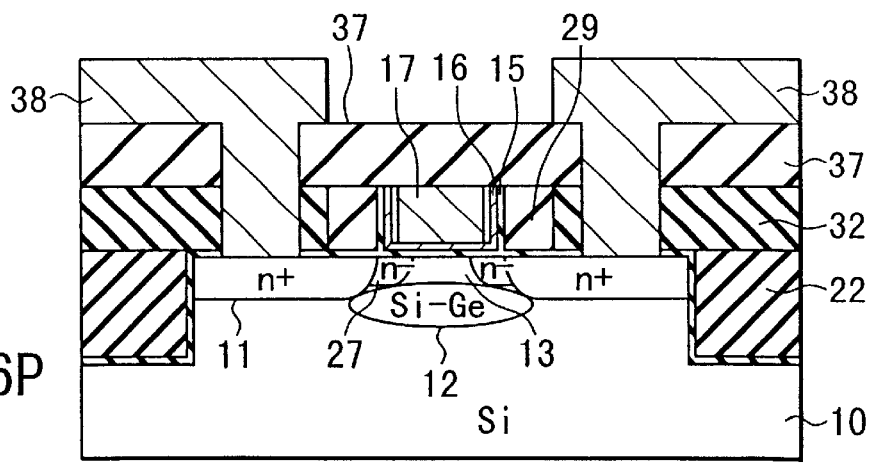

Next, as shown in FIG. 6N, a TiN layer 16, which are barrier metal and part of the gate electrode, and an Al gate electrode 17 are formed by deposition to a thickness of about 10 nm and 250 nm, respectively. Then, as shown in FIG. 6O, the Al gate electrode 17 and TiN layer 16 are etched back and flattened by CMP techniques until the surface of the TEOS oxide film 32 is exposed. This completes the processing of the metal (Al/TiN) gate.

Thereafter, as found in ordinary LSI manufacturing processes, an interlayer insulating film 37 composed of a plasma TEOS film is formed by CVD techniques and then contact holes are made, followed by the formation of aluminum wires 38 for the upper layer wiring, as shown in FIG. 6P.

As described above, with the present invention, a high-mobility, high-gate-breakdown-voltage metal (TiN) gate CMOS transistor with low threshold voltages of NMOS and PMOS transistors can be realized by simple manufacturing processes.

Second Embodiment

A CMOSFET according to a second embodiment of the present invention has the same basic configuration as that of the first embodiment except that part of the configuration and part of the manufacturing method differ from those of the first embodiment.

FIG. 8A is a sectional view showing the configuration of an NMOSFET in a CMOSFET according to the second embodiment and FIG. 8B is a sectional view showing the configuration of a PMOSFET in the CMOSFET according to the second embodiment. In FIGS. 8A and 8B, the same parts as those of FIGS. 1A and 1B are indicated by the same reference symbols and a detailed explanation of them will be omitted.

In a CMOSFET in a silicon substrate 10, metal material (Al/TiN) is used for a gate electrode and an Si—Ge layer 70 is formed all over the surface of the silicon substrate 10. As shown in FIG. 8A, a tensile-strained Si channel layer 69 formed on the Si—Ge layer 70 is used as the channel layer of an NMOSFET section and an Si—Ge layer (under compressive stress) 70 is used as the channel layer of a PMOSFET section.

The process of manufacturing a CMOSFET using the basic configuration of the CMOSFET will be explained using FIGS. 9A to 9I and FIGS. 10A to 10I. FIGS. 9A to 9I are sectional views to help explain the process of manufacturing the NMOSFET shown in FIG. 8A. FIGS. 10A to 10I are sectional views to help explain the process of manufacturing the PMOSFET shown in FIG. 8B.

Explanation will be given in the order of processes. Since the first half of the processes are the same as those of the first embodiment, the latter half will be explained. The second embodiment differs from the first embodiment in that the semiconductor silicon substrate 10 where an Si—Ge layer 70 (for example, with a thickness of 30 nm) has grown epitaxially all over the substrate surface is used. The Si—Ge layer 70 is formed by growing the substrate epitaxially using $SiH_4$, $Si_2H_6$, $Si_3H_8$ or the like as an Si source gas and $GeF_4$, $GeH_4$ or the like as a Ge source gas after the pretreatment of annealing the silicon substrate 10 in an atmosphere of hydrogen at 800° C. to 900° C. and removing the natural oxide film at the surface.

Figure 9A:
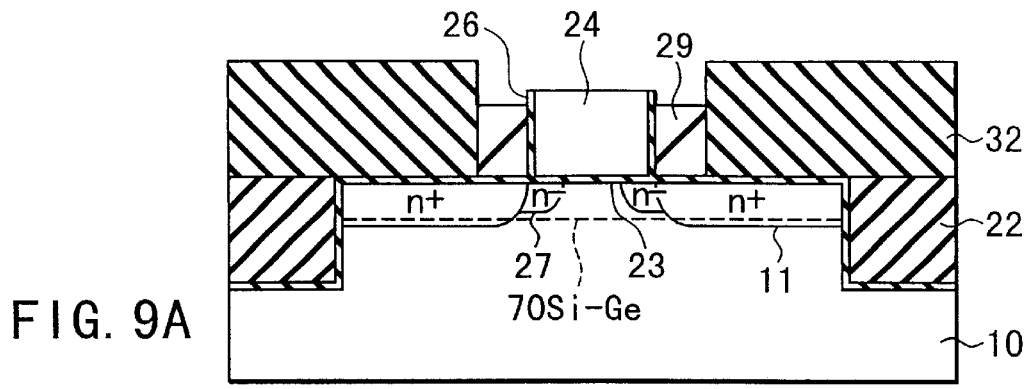
FIGS. 9A to 9I are sectional views to help explain the process of manufacturing the NMOSFET shown in FIG. 8A.
Figure 9B:
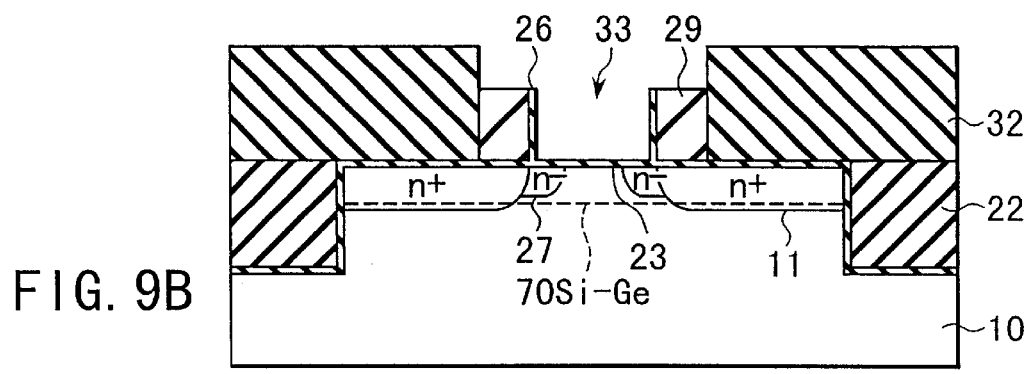
Figure 10A:
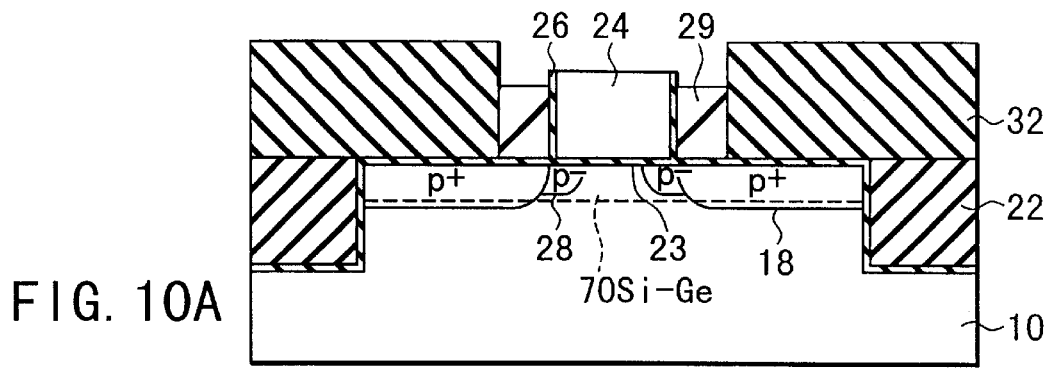
FIGS. 10A to 10I are sectional views to help explain the process of manufacturing the PMOSFET shown in FIG. 8B.
Figure 10B:
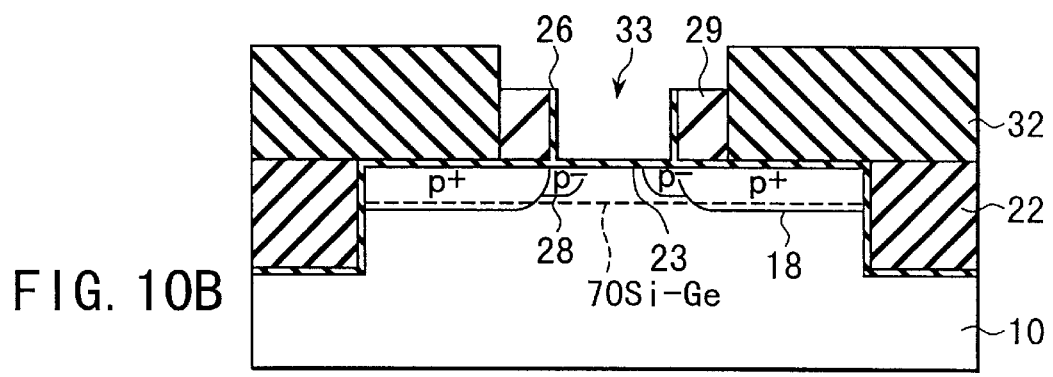

FIGS. 9A and 10A are sectional views of the substrate with the silicon nitride film 25, part of the dummy gate, removed. Then, as shown in FIGS. 9B and 10B, the polysilicon film 24, the dummy gate, is removed and an groove 33 is made in the region where a gate electrode is to be formed.

Figure 9C:
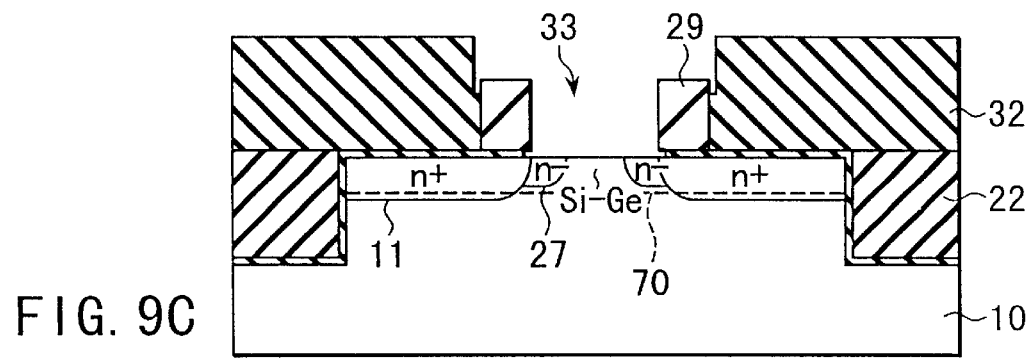
Figure 10C:
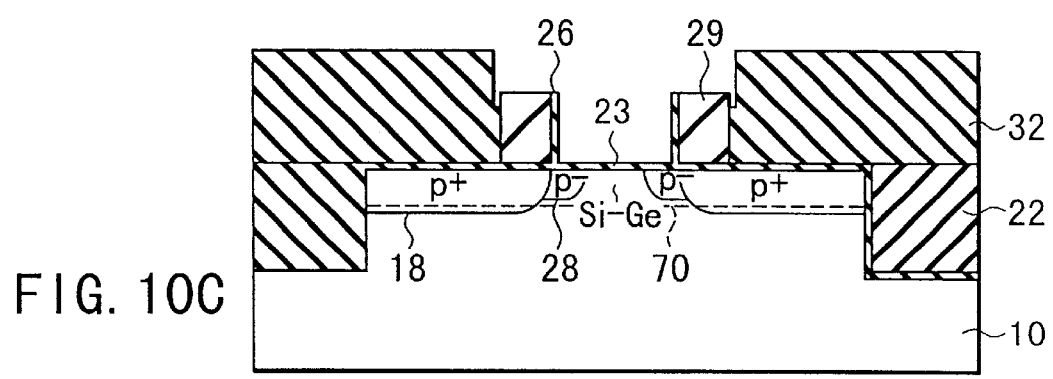

Next, as shown in FIGS. 9C and 10C, after the regions other than the NMOSFET region are covered with a resist film by lithography, only the NMOSFET region is wet etched by HF and the thermal oxidation film 23 is removed by wet etching.

Figure 9D:
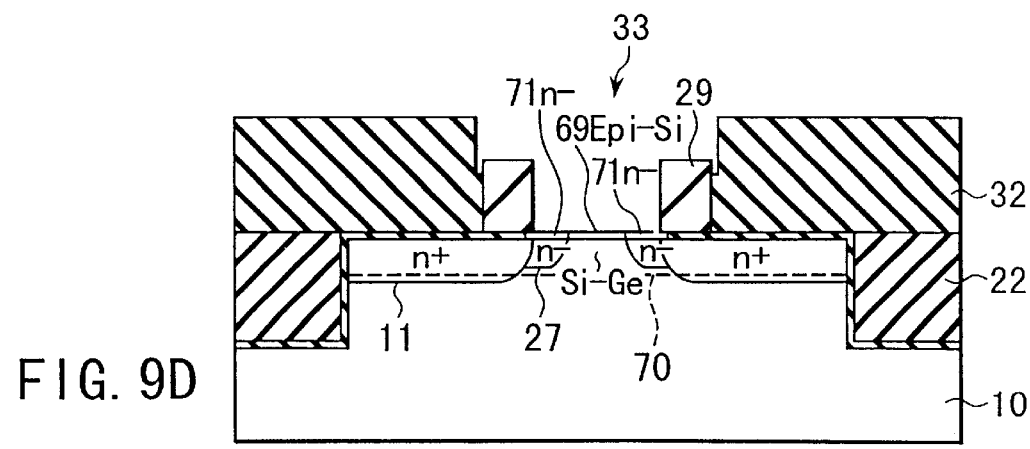
Figure 10D:
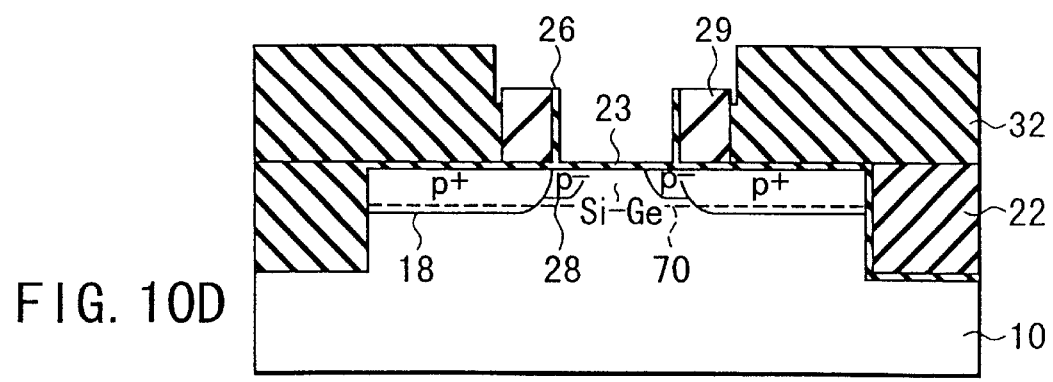

Then, as shown in FIGS. 9D and 10D, Si 69 is grown epitaxially at the surface of the Si—Ge layer 70 exposed in the NMOSFET region. In this process, a tensile-strained Si channel layer 69 is formed on the Si—Ge layer 70 only in the NMOSFET region. As described above, it is easy to selectively form the NMOS channel layer (tensile-strained Si channel layer) or PMOS channel layer (Si—Ge).

To prevent an offset from occurring between the gate and the source/drain, it is desirable that the $n^-$ diffused layer 27 should extend into the tensile-strained Si channel layer 69. Namely, it is desirable that both ends of the tensile-strained Si channel layer 69 should be $n^-$ diffused layers 71 into which n-type impurities have been introduced.

Such a structure can be formed by designing the heating process or impurity-doping process suitably. The peak impurity concentration in the $n^-$ diffused layers 71 is about $1×10^{20} cm^{-3}$.

Figure 9E:
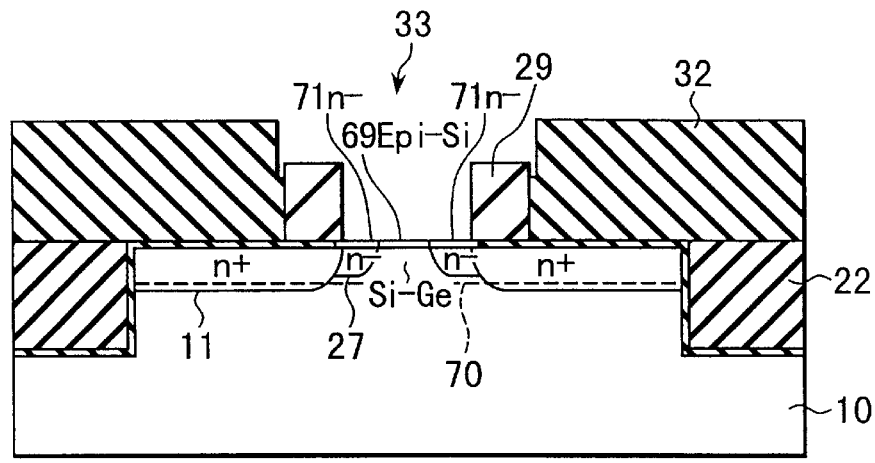
Figure 9F:
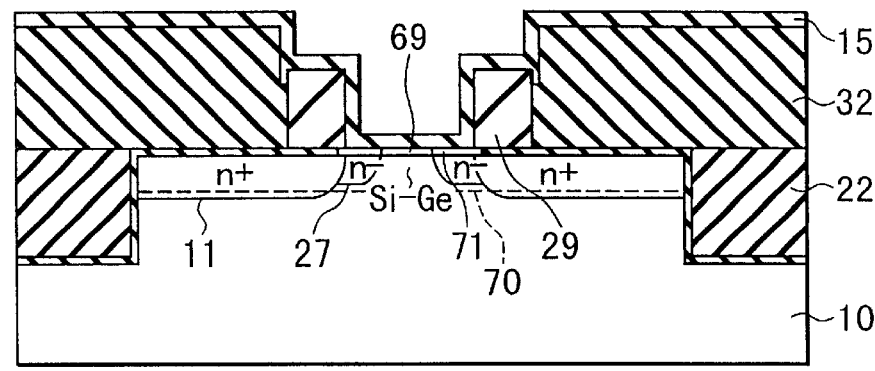
Figure 10E:
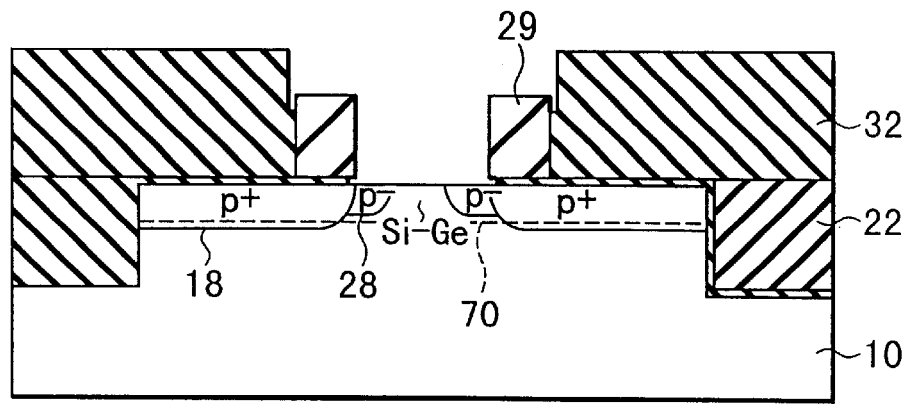
Figure 10F:
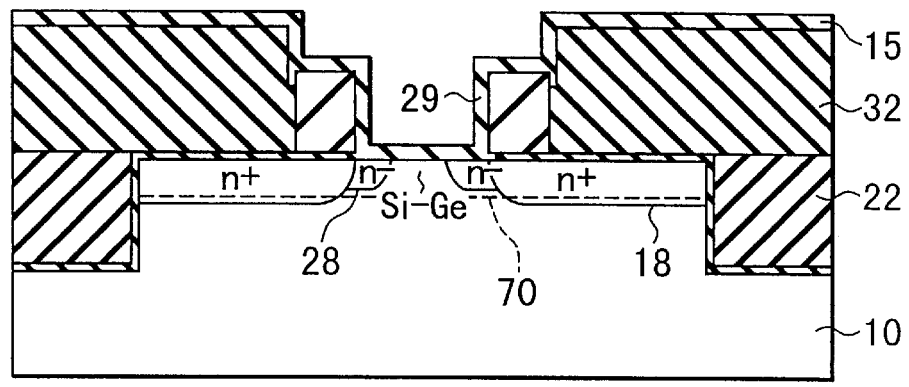

Next, as shown in FIGS. 9E and 10E, the thermal oxidation film 23 is also removed. Thereafter, a gate insulating film and a gate electrode are formed. Since the source and drain have been formed (including activation) and basically there is no high-temperature process higher than 600° C. or more thereafter, neither misfit dislocation nor Ge segregation takes place, improving the gate breakdown voltage. Because post-treatment is carried out at lower temperatures, high dielectric films or ferroelectric films, such as a $Ta_2O_5$ film or $(Ba, Sr)TiO_3$ may be used for the gate insulating film and metal material may be used for the gate electrode. The selection of gate electrode material and a method of forming the gate electrode are the same as those in the first embodiment.

Figure 9G:
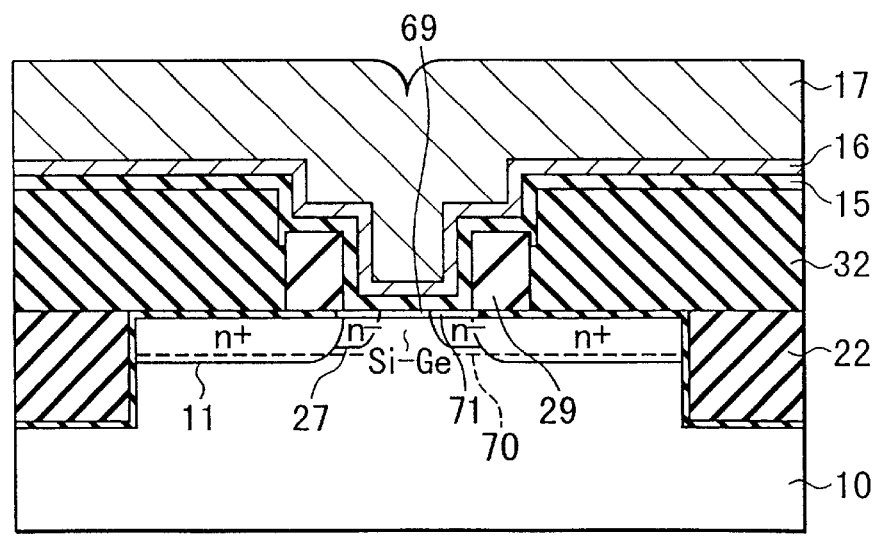
Figure 9H:
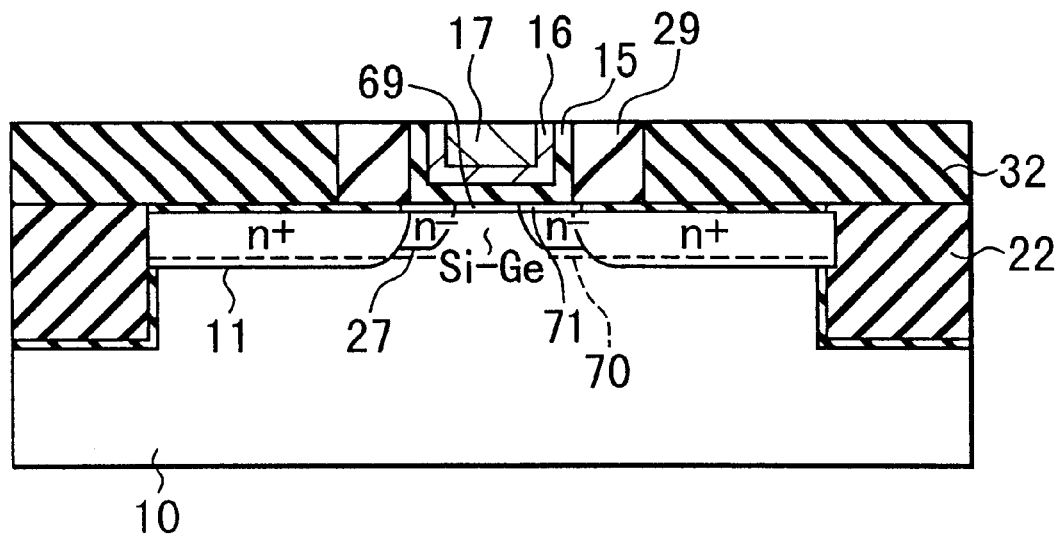
Figure 9I:
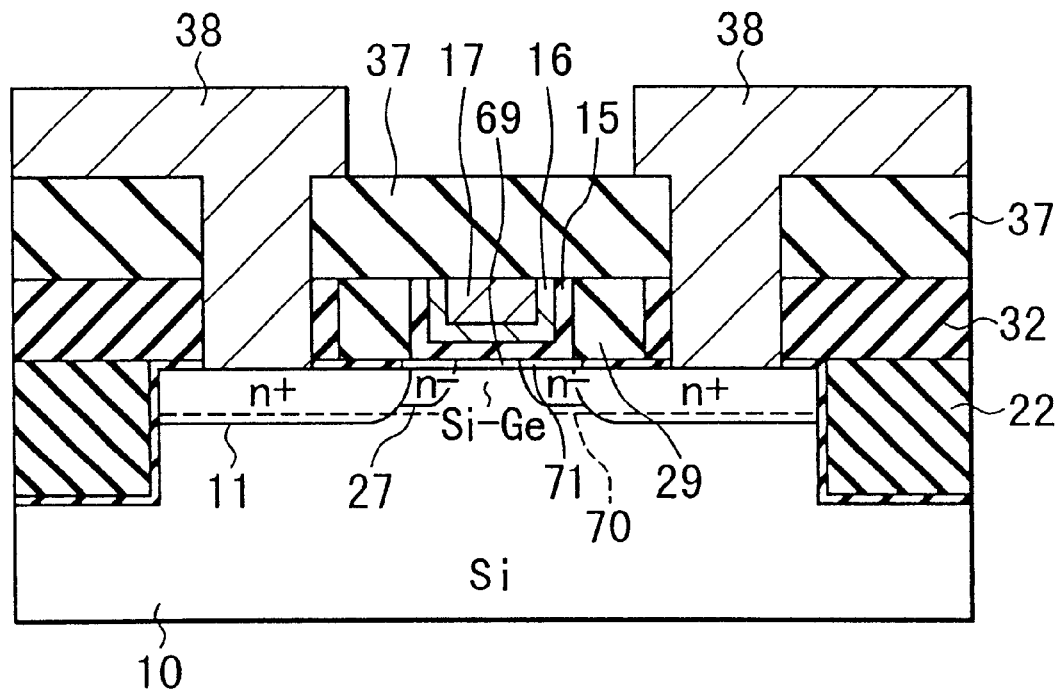
Figure 10G:
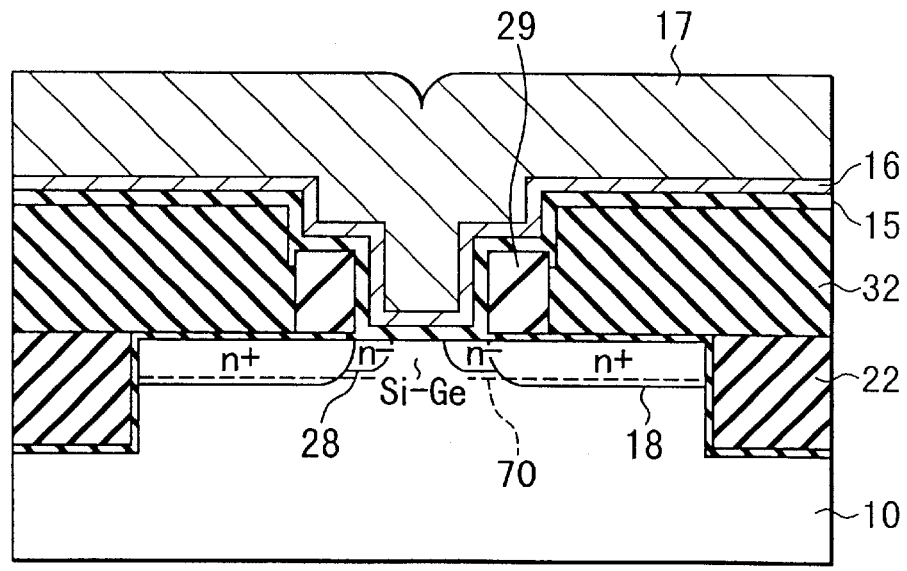
Figure 10H:
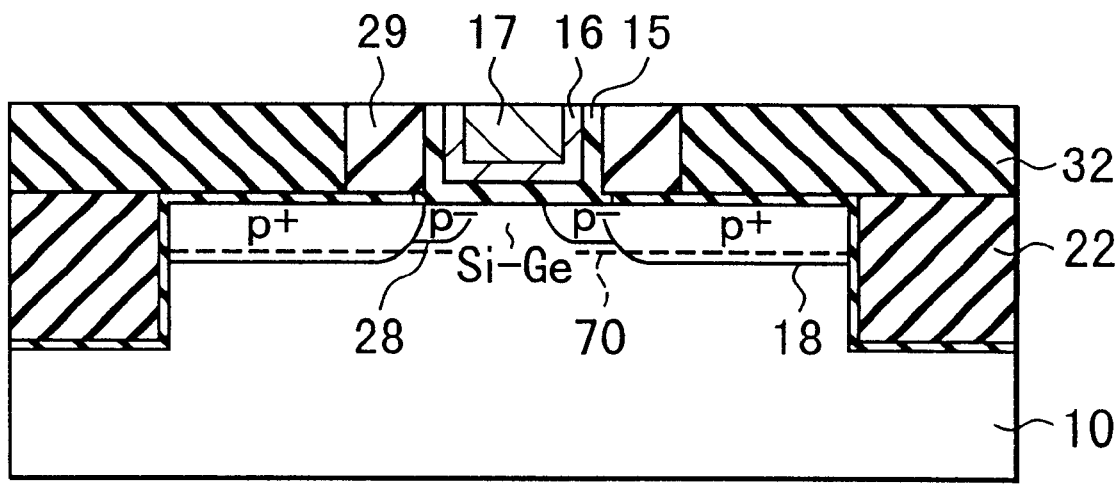

Following that, as in the first embodiment, after a $Ta_2O_5$ film is formed as the gate insulating film (FIGS. 9F and 10F), barrier metal TiN 16 and aluminum 17 are formed by deposition as the gate electrodes to a thickness of about 10 nm and 250 nm, respectively (FIGS. 9G and 10G). Then, they are etched back and flattened by CMP techniques (FIGS. 9 and 10H). This completes the processing of the metal (Al/TiN) gate.

As seen from the values of the work functions and values of the bandgaps for the gate material and channel material (FIG. 2), the combination of the metal (Al/TiN) gate with the strained Si channel layer (NMOS) and with Si—Ge channel layer (PMOS) lowers the threshold voltages of both of the NMOS and PMOS (by about 0.2V), which makes threshold voltage adjustment easier. When an attempt is made to realize a low threshold voltage in an ordinary Si channel layer, it is necessary to make the concentration of impurities at the surface of the substrate very low or implant counter-channel ions. Namely, the inevitable result is a structure easily affected by the short channel effect or an buried-channel MOSFET structure.

Figure 10I:
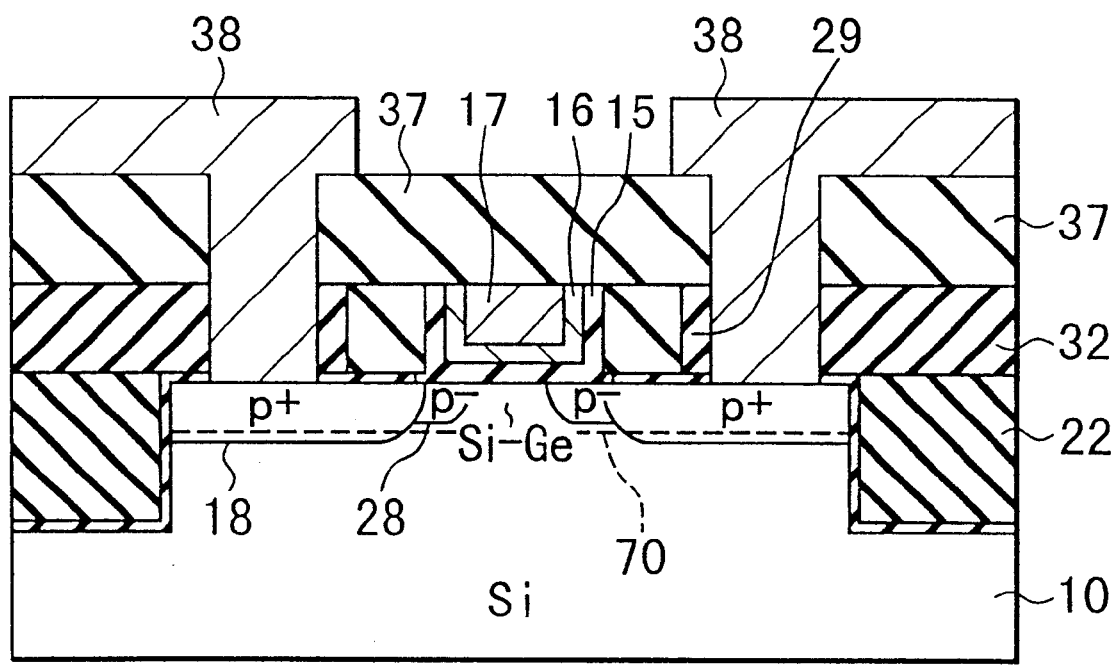

From this point on, as in ordinary manufacturing processes, an interlayer insulating film 37 is formed by CVD techniques, contact holes are made, and aluminum wires 38 for the upper layer wiring are formed (FIGS. 9I and 10I).

As described above, with the present invention, a high-mobility, high-gate-breakdown-voltage metal (TiN) gate CMOS transistor with low threshold voltages of NMOS and PMOS transistors can be realized by simple manufacturing processes.

Third Embodiment

Figure 11A:
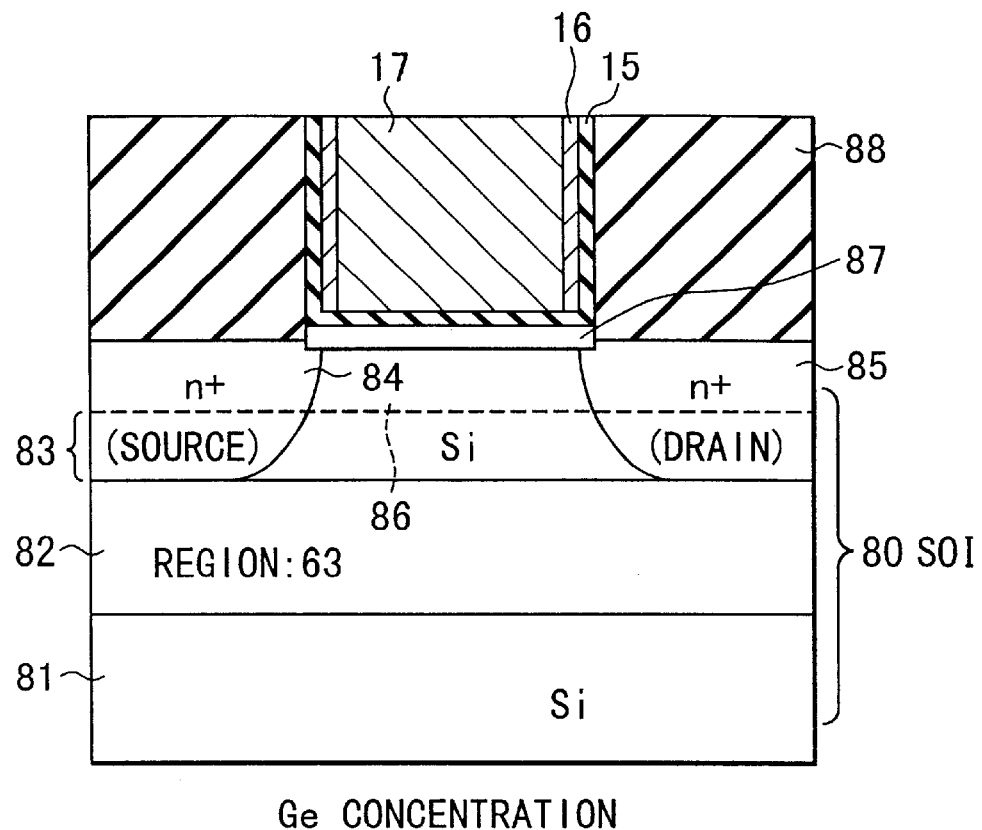
FIG. 11A is a sectional view showing the configuration of a CMOSFET according to a third embodiment of the present invention.

FIG. 11A is a sectional view showing the configuration of a CMOSFET according to a third embodiment of the present invention. In an NMOSFET at an SOI substrate 80, metal material (AL 17/TiN 16) is used for a gate electrode. The SOI substrate 80 is composed of an Si support substrate 81, an $SiO_2$ layer 82, and a single-crystal Si layer 83. At the surface of the single-crystal Si layer 83, Si—Ge layers 84, 85, 86 are formed. At the surface of the Si—Ge layer 86, a tensile-strained Si channel layer 87 formed by epitaxial growth and acting as the channel layer of an FET is formed.

The third embodiment is further characterized in that the concentration of Ge in the Si—Ge layer 84 acting as the source region is higher than that in the Si—Ge layer 86 under the channel layer (tensile-strained Si channel layer 87). (Such a structure is easy to form. For example, with a dummy gate as a mask, ions of high-concentration Ge has only to be implanted into the source region.)

Changing the concentration Ge in the part under the channel layer and the source region prevents the floating body effect, which often becomes a problem in the SOI substrate. This is because the bandgap on the source side is smaller than the bandgap on the channel layer side, which causes holes accumulated in the Si—Ge layer (near the source) under the channel layer to be drawn into the source.

Figure 11B:
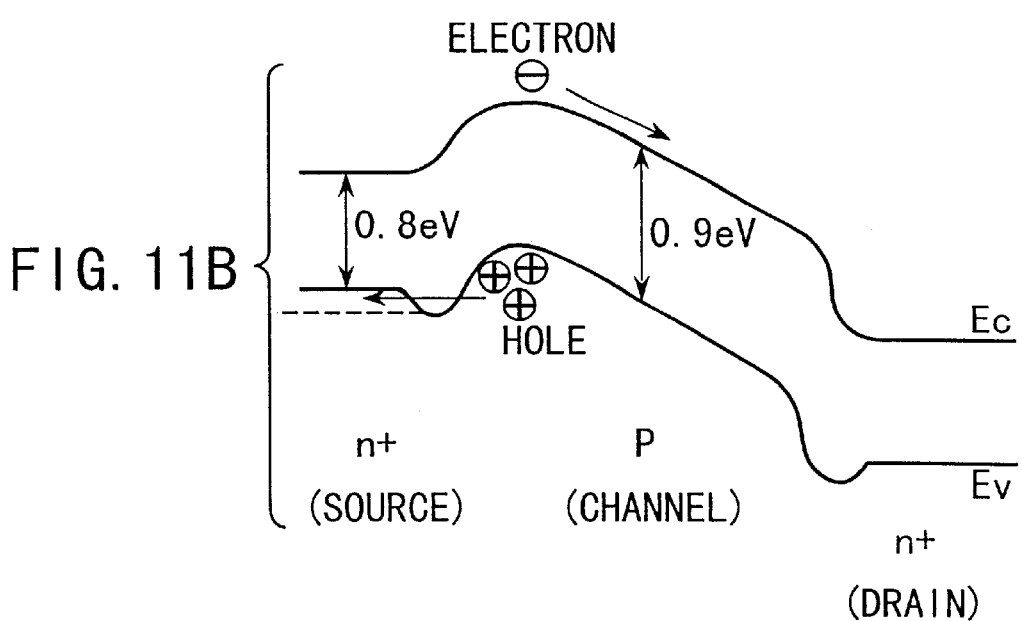
FIG. 11B shows the band structure of a typical Si—Ge layer.

FIG. 11B shows the typical band structure of a Si—Ge layer. When the concentration of Ge in the source/drain region is 30% and the concentration of Ge in the Si—Ge layer under the channel layer is 15%, the bandgaps of the individual regions are about 0.8 and 0.9 eV respectively, which enables the Si—Ge layer to be used as the channel layer, while preventing the floating body effect.

Fourth Embodiment

A CMOSFET according to a fourth embodiment of the present invention has the same basic configuration as that of the first and second embodiments except that part of the manufacturing method differs from that of the first and second embodiments.

Figure 12A:
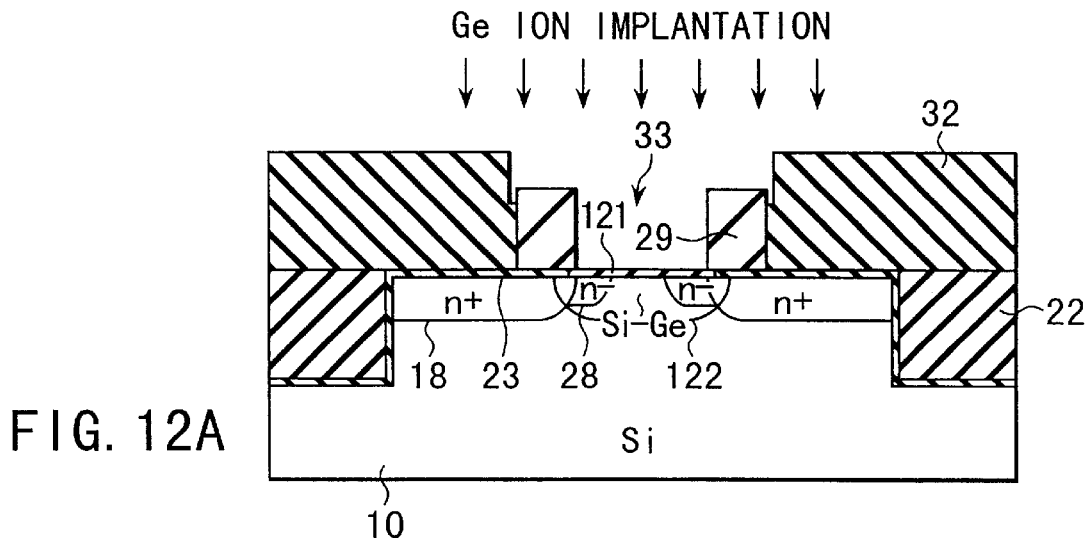
FIGS. 12A to 12C are sectional views to help explain the process of manufacturing an NMOSFET section in a CMOSFET according to a fourth embodiment of the present invention.
Figure 12B:
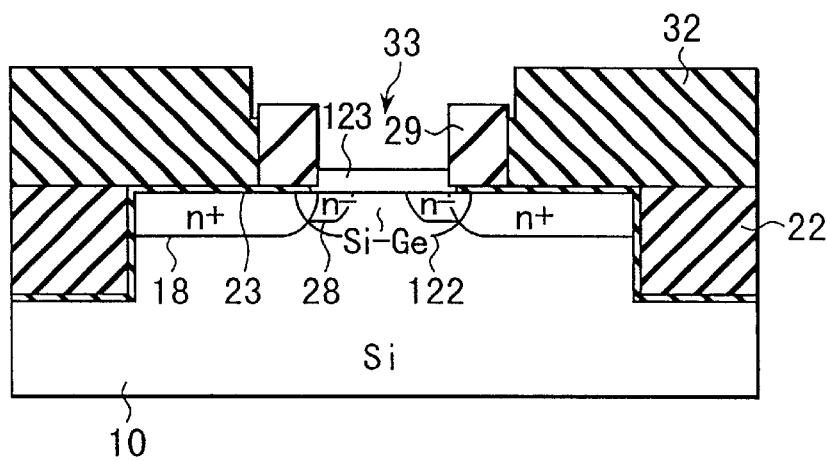
Figure 12C:
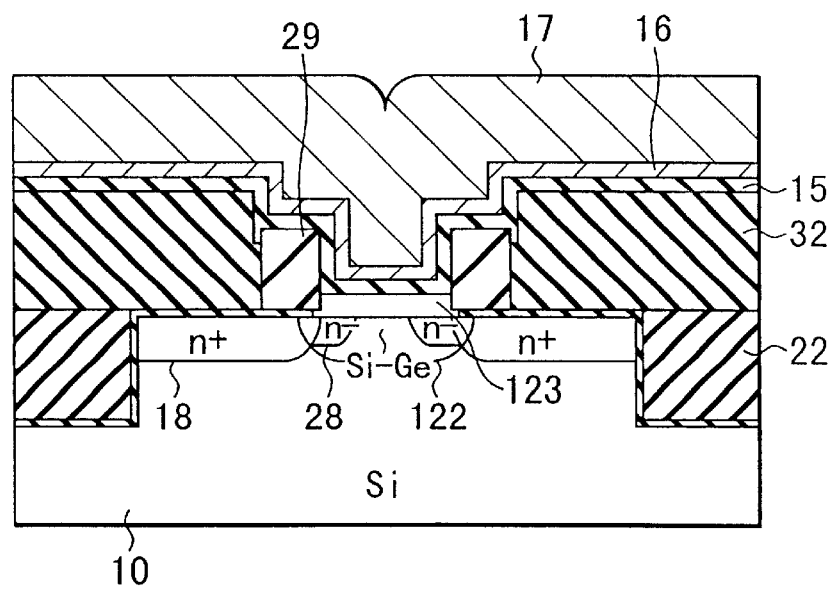
Figure 13A:
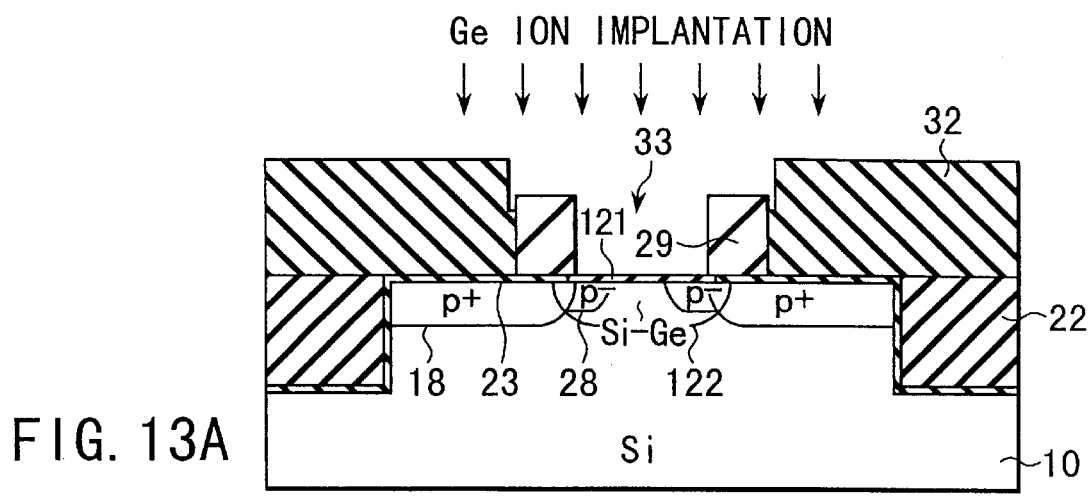
FIGS. 13A to 13C are sectional views to help explain the process of manufacturing a PMOSFET section in the CMOSFET according to the fourth embodiment.
Figure 13B:
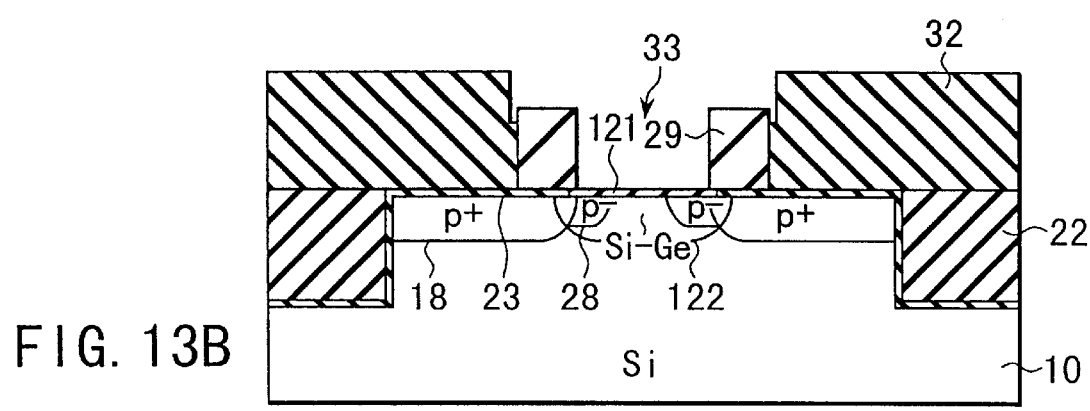
Figure 13C:
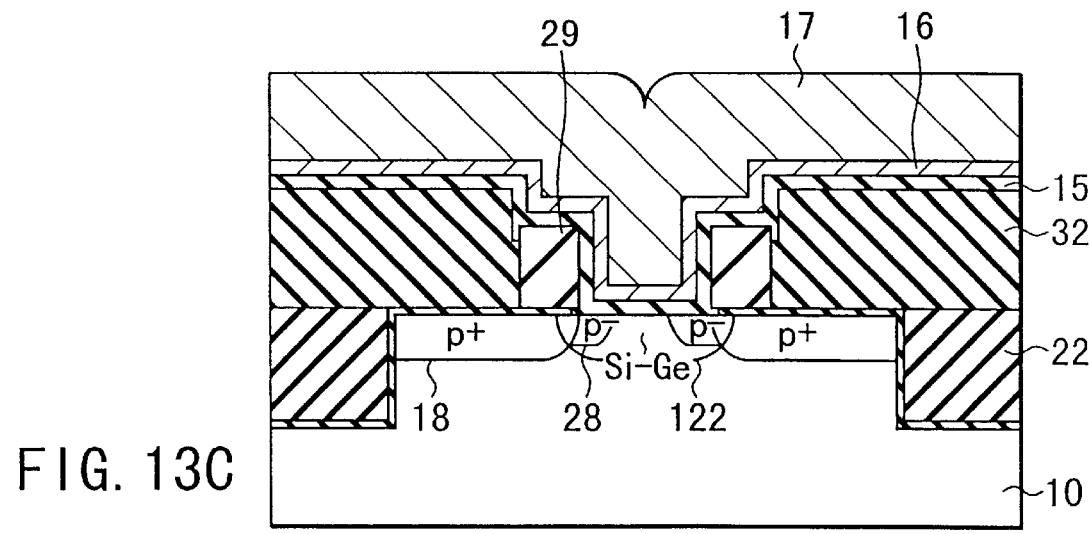

The process of manufacturing a CMOSFET according to the fourth embodiment will be explained by reference to FIGS. 12A to 12C and FIGS. 13A to 13C. FIGS. 12A to 12C are sectional views to help explain the process of manufacturing an NMOSFET section. FIGS. 13A to 13C are sectional views to help explain the process of manufacturing a PMOSFET section.

Explanation will be given in the order of processes. Since the first half of the processes (up to FIGS. 6I and 7I) are the same as those of the first embodiment, the latter half will be explained.

First, as shown in FIGS. 12A and 13A, after the dummy gate is removed, an oxide film 121 as thin as about 3 nm is formed in the channel region at the surface of the Si substrate 10. Then, Ge ions are implanted via the oxide film 121, thereby forming a Si—Ge layer 122 in the NMOSFET region and PMOSFET region at the surface of the Si substrate 10.

Then, as shown in FIG. 12B, after the oxide film 121 on the NMOSFET region side is selectively removed, an Si layer is grown epitaxially at the surface of the Si—Ge layer 122 exposed on the NMOSFET region side, thereby forming a tensile-strained Si channel layer 123. During the epitaxial growth of the Si layer, the Si layer does not grow epitaxially at the surface of the Si substrate 10 on the PMOSFET side, because the oxide film 121 has been formed as shown in FIG. 13B.

Then, as shown in FIGS. 12C and 13C, an SiN layer (not shown), a $Ta_2O_5$ film 15, a TiN layer 16, and an Al gate electrode 17 are formed by deposition as in the first embodiment.

Thereafter, the Al gate electrode 17 and TiN layer 16 are etched back and flattened until the surface of the TEOS oxide film 32 is exposed, which completes the processing of the metal (Al/TiN) gate. Then, after an interlayer insulating film is formed, contact holes are made and aluminum wires for the upper layer wiring are formed.

Fifth Embodiment

A CMOSFET according to a fifth embodiment of the present invention has the same basic configuration as that of the first and second embodiments except that part of the manufacturing method differs from that of the first and second embodiments.

Figure 14A:
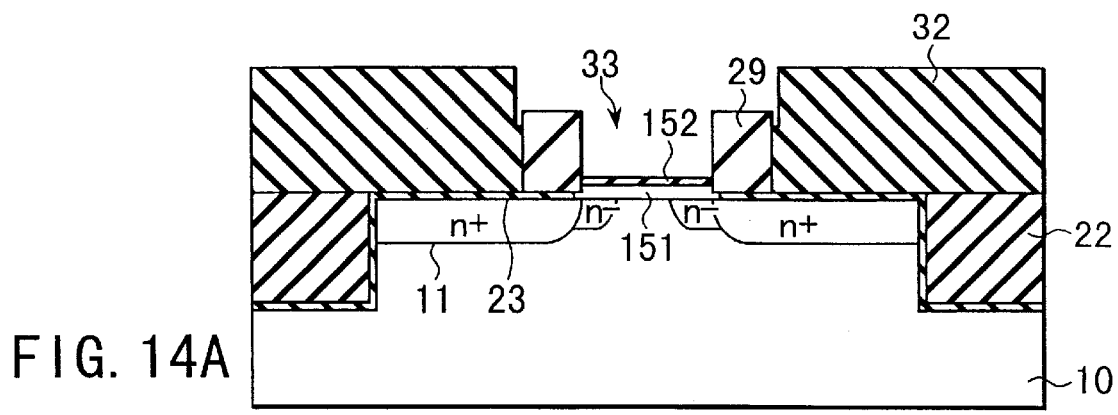
FIGS. 14A to 14C are sectional views to help explain the process of manufacturing an NMOSFET section in a CMOSFET according to a fifth embodiment of the present invention.
Figure 14B:
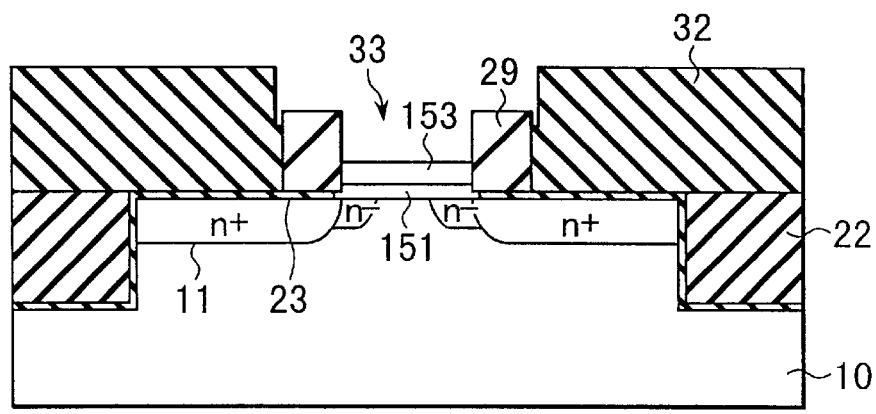
Figure 14C:
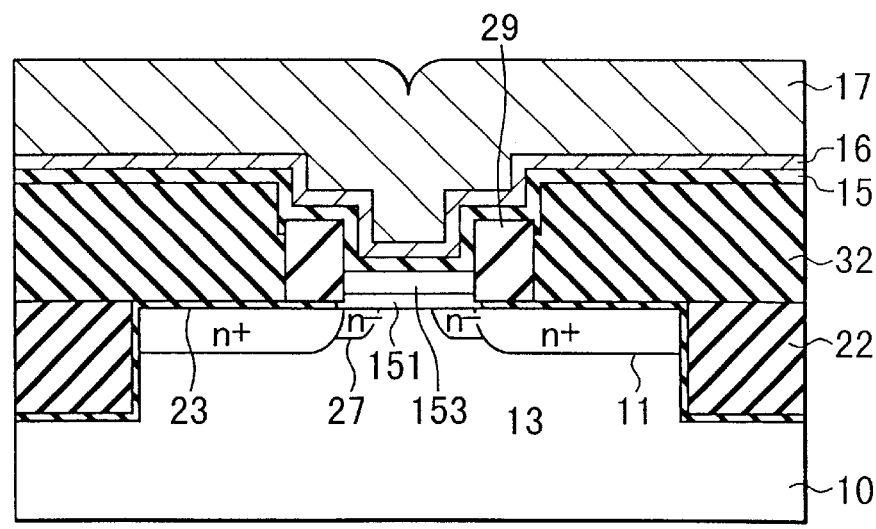
Figure 15A:
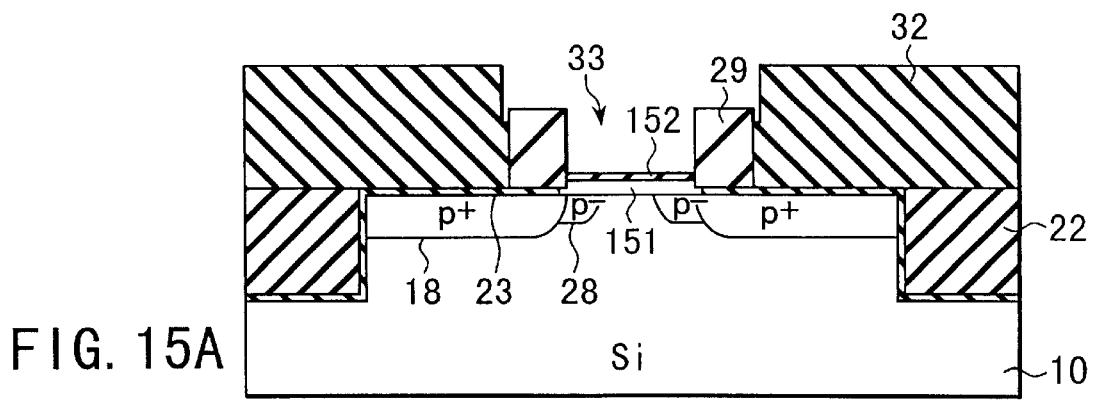
FIGS. 15A to 15C are sectional views to help explain the process of manufacturing a PMOSFET section in the CMOSFET according to the fifth embodiment.
Figure 15B:
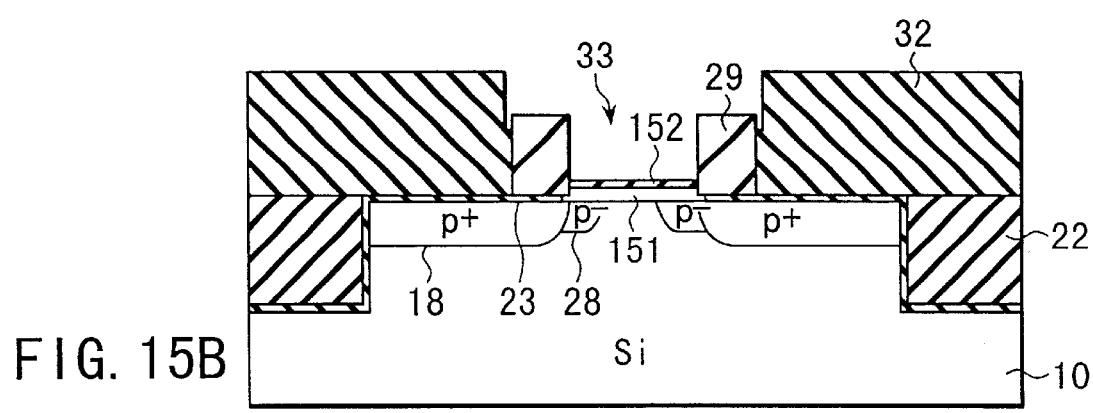
Figure 15C:
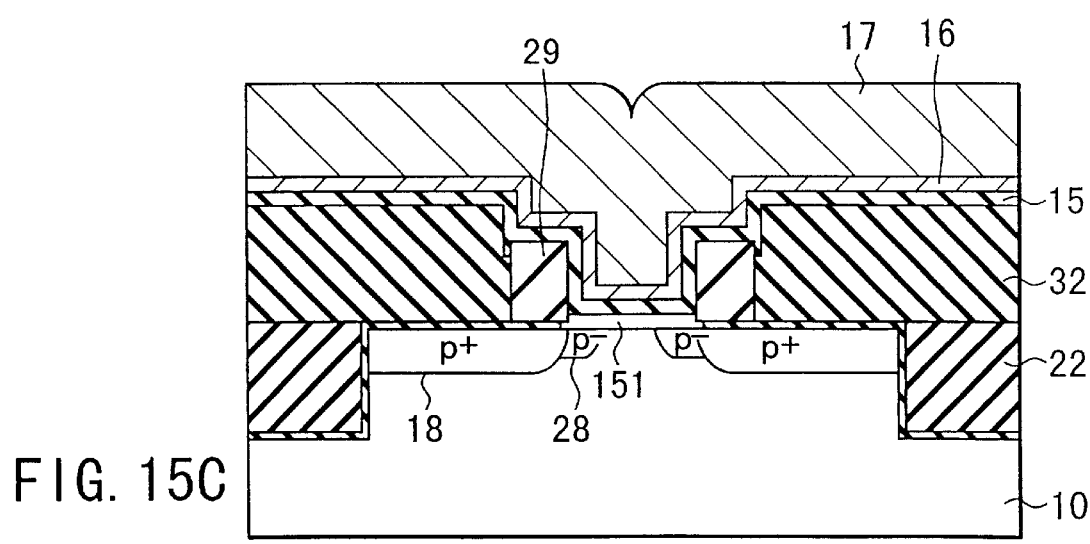

The process of manufacturing a CMOSFET according to the fifth embodiment will be explained by reference to FIGS. 14A to 14C and FIGS. 15A to 15C. FIGS. 14A to 14C are sectional views to help explain the process of manufacturing an NMOSFET section. FIGS. 15A to 15C are sectional views to help explain the process of manufacturing a PMOSFET section.

Explanation will be given in the order of processes. Since the first half of the processes (up to FIGS. 6J and 7J) are the same as those of the first embodiment, the latter half will be explained.

After the dummy gate is removed, the surface of the Si substrate 10 in the NMOSFET and PMOSFET regions are cleaned by HF as shown in FIGS. 14A and 15A and thereafter an Si—Ge layer 151 with a thickness of about 15 nm is grown epitaxially on the Si substrate 10 in the NMOSFET and PMOSFET regions. Then, the surface of the Si—Ge layer 151 is oxidized to form a nearly 2-nm-thick oxide film 152.

Then, as shown in FIG. 14B, after the oxide film 152 on the NMOSFET region side is selectively removed, an Si layer is selectively grown epitaxially at the surface of the Si—Ge layer 151 exposed on the NMOSFET region side, thereby forming a tensile-strained Si channel layer 153.

During the epitaxial growth of the Si layer, the Si layer does not grow epitaxially at the surface of the Si substrate 10 on the PMOSFET side, because the oxide film 152 has been formed as shown in FIG. 15B.

Then, as shown in FIGS. 14C and 15C, an SiN layer (not shown), a $Ta_2O_5$ film 15, a TiN layer 16, and an Al gate electrode 17 are formed by deposition as in the first embodiment.

Thereafter, the Al gate electrode 17 and TiN layer 16 are etched back and flattened by CMP until the surface of the TEOS oxide film 32 is exposed, which completes the processing of the metal (Al/TiN). Then, after an interlayer insulating film is formed, contact holes are made and aluminum wires for the upper layer wiring are formed.

The present invention is not limited to the above embodiments. For instance, while a stacked structure of TiN/Al has been used as the gate electrode, the invention is restricted to neither those materials nor the stacked structure.

The present invention may be practiced or embodied in still other ways without departing from the spirit or essential character thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device in which an NMOSFET and a PMOSFET is formed on a silicon substrate, wherein
    gate electrodes of said NMOSFET and PMOSFET are made of metallic materials,
    an Si—Ge layer is formed in at least part of the surface regions including respective channel layers of said NMOSFET and PMOSFET, and
    the concentration of Ge in the channel layer of said NMOSFET is lower than the concentration of Ge in the channel layer of said PMOSFET.

2. The semiconductor device according to claim 1, wherein said silicon substrate is an SOI substrate and the concentration of Ge in the channel layers of said NMOSFET is lower than the concentration of Ge in the sources of said NMOSFET.

3. The semiconductor device according to claim 1, wherein an Si layer on the Si—Ge layer is used as the channel layer of said NMOSFET and the Si—Ge layer is used as the channel layer of said PMOSFET.

4. The semiconductor device according to claim 3, wherein a stacked structure of said Si—Ge layer and Si layer is formed only almost under a gate electrode of said NMOSFET.

5. The semiconductor device according to claim 3, wherein the Si layer on the Si—Ge layer has a thickness of from 2 nm to 30 nm.

6. The semiconductor device according to claim 3, wherein the Si—Ge layer of said NMOSFET is formed of $Si_{1-x}Ge_x$ ($0.1 \leq x \leq 0.9$).

7. The semiconductor device according to claim 3, wherein said silicon substrate is an SOI substrate and the concentration of Ge in the channel layer of said NMOSFET is lower than the concentration of Ge in the source of said NMOSFET.

8. The semiconductor device according to claim 1, wherein the height of the surface of the gate electrode of said NMOSFET is equal to the height of the surface of the gate electrode of said PMOSFET.

9. The semiconductor device according to claim 1, wherein gate insulating films of said NMOSFET and PMOSFET are made of $Ta_2O_5$.

10. The semiconductor device according to claim 1, wherein portions of the gate electrodes of said NMOSFET and PMOSFET contacting the gate insulating films are made of TiN.

11. The semiconductor device according to claim 1, wherein gate insulating films of said NMOSFET and PMOSFET are made of $Ta_2O_5$ and portions of the gate electrodes of said NMOSFET and PMOSFET contacting the gate insulating films are made of TiN.

12. A semiconductor device in which an NMOSFET has been formed in a silicon substrate, wherein a gate electrode of said NMOSFET is made of metallic material, and
    a tensile-strained Si layer on an Si—Ge layer is used as a channel layer of said NMOSFET.

13. The semiconductor device according to claim 12, wherein said silicon substrate is an SOI substrate and concentration of Ge in the channel layer of said NMOSFET is lower than concentration of Ge in a source of said NMOSFET.

14. The semiconductor device according to claim 12, wherein an Si layer on the Si—Ge layer is used as the channel layer of said NMOSFET and the Si—Ge layer is used as a channel layer of a PMOSFET formed on said Silicon substrate.

15. The semiconductor device according to claim 14, wherein the Si layer on the Si—Ge layer has a thickness of from 2 nm to 30 nm.

16. The semiconductor device according to claim 14, wherein the Si—Ge layer of said NMOSFET is formed of $Si_{1-x}Ge_x$ ($0.1 \leq x \leq 0.9$).

17. The semiconductor device according to claim 12, wherein a stacked structure of said Si—Ge layer and Si layer is formed only almost under a gate electrode of said NMOSFET.

18. The semiconductor device according to claim 14, wherein said silicon substrate is an SOI substrate and a concentration of Ge in a channel layer of said NMOSFET is lower than a concentration of Ge in a source of said NMOSFET.

* * * * *